(12) United States Patent
Terui et al.

(10) Patent No.: US 9,842,993 B2
(45) Date of Patent: Dec. 12, 2017

(54) FILM-FORMING COMPOSITION, FILM FORMED THEREBY, AND METHOD FOR MANUFACTURING ORGANIC SEMICONDUCTOR ELEMENT USING SAME

(71) Applicant: Central Glass Company, Limited, Ube-shi, Yamaguchi (JP)

(72) Inventors: Yoshiharu Terui, Matsusaka (JP); Haruhiko Komoriya, Saitama (JP); Fumito Kobayashi, Matsusaka (JP); Yukari Hara, Fujimino (JP); Ikunari Hara, Saitama (JP)

(73) Assignee: Central Glass Company, Limited, Ube-shi (JP)

( * ) Notice: Subject to any disclaimer, the term of this patent is extended or adjusted under 35 U.S.C. 154(b) by 0 days.

(21) Appl. No.: 14/905,464

(22) PCT Filed: Jul. 14, 2014

(86) PCT No.: PCT/JP2014/068663
§ 371 (c)(1),
(2) Date: Jan. 15, 2016

(87) PCT Pub. No.: WO2015/008720
PCT Pub. Date: Jan. 22, 2015

(65) Prior Publication Data
US 2016/0181531 A1    Jun. 23, 2016

(30) Foreign Application Priority Data

Jul. 19, 2013 (JP) .................................. 2013-150002
Jul. 10, 2014 (JP) .................................. 2014-142189

(51) Int. Cl.
H01L 51/52 (2006.01)
H01L 51/00 (2006.01)
(Continued)

(52) U.S. Cl.
CPC ........ *H01L 51/0018* (2013.01); *C09D 133/16* (2013.01); *G03F 7/0002* (2013.01);
(Continued)

(58) Field of Classification Search
None
See application file for complete search history.

(56) References Cited

U.S. PATENT DOCUMENTS 6,723,485 B1    4/2004 Tsutumi et al.
2003/0232940 A1   12/2003 Komoriya et al.
(Continued)

FOREIGN PATENT DOCUMENTS

JP    2001-154362 A    6/2001
JP    2002-155117 A    5/2002
(Continued)

OTHER PUBLICATIONS

International Search Report (PCT/ISA/210) issued in PCT Application No. PCT/JP2014/068663 dated Oct. 14, 2014 with English translation (six pages).
(Continued)

*Primary Examiner* — Michael Lebentritt
(74) *Attorney, Agent, or Firm* — Crowell & Moring LLP

(57) ABSTRACT

A film-forming composition according to the present invention include fluororesin having a repeating unit of the general formula (1); and a fluorine-containing solvent.
(Continued)

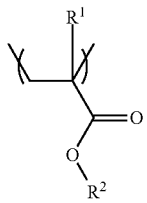

(1)

In the general formula (1), $R^1$ each independently represents a hydrogen atom, a fluorine atom, a methyl group or a trifluoromethyl group; and $R^2$ each independently represents $C_1$-$C_{15}$ straight, $C_3$-$C_{15}$ branched or $C_3$-$C_{15}$ cyclic fluorine-containing hydrocarbon gr which any hydrogen atom may be replaced by a fluorine atom with the proviso that the repeating unit contains at least one fluorine atom. This film-forming composition is suitably usable for the manufacturing of an organic semiconductor element because the composition can form a film on an organic semiconductor film; and the formed film has resistance to an etching solvent during the fine pattern processing of the organic semiconductor film by photolithography etc.

17 Claims, 1 Drawing Sheet

(51) Int. Cl.

| | | |
|---|---|---|
| *C09D 133/16* | (2006.01) | |
| *G03F 7/00* | (2006.01) | |
| *G03F 7/004* | (2006.01) | |
| *H01L 51/05* | (2006.01) | |
| *C08K 5/02* | (2006.01) | |
| *C08K 5/06* | (2006.01) | |

(52) U.S. Cl.
CPC .......... *G03F 7/0046* (2013.01); *G03F 7/0048* (2013.01); *H01L 51/0019* (2013.01); *C08K 5/02* (2013.01); *C08K 5/06* (2013.01); *H01L 51/0052* (2013.01); *H01L 51/0558* (2013.01)

(56) References Cited

U.S. PATENT DOCUMENTS

| | | | | |
|---|---|---|---|---|
| 2005/0118817 | A1 | 6/2005 | Fujita et al. | |
| 2008/0146841 | A1* | 6/2008 | Kaneko | C07C 303/22 562/825 |
| 2010/0255420 | A1* | 10/2010 | Sakakibara | C08F 220/18 430/285.1 |
| 2013/0101929 | A1* | 4/2013 | Korenaga | G03G 5/0539 430/56 |
| 2013/0119383 | A1 | 5/2013 | Nomoto | |
| 2014/0024217 | A1 | 1/2014 | Ohtsu et al. | |
| 2014/0335634 | A1* | 11/2014 | Kasai | B29C 33/68 438/26 |
| 2014/0363919 | A1 | 12/2014 | Nomoto | |
| 2016/0164047 | A1* | 6/2016 | Komoriya | H01L 51/0018 257/40 |
| 2016/0250830 | A1* | 9/2016 | Kiya | C08J 7/12 |

FOREIGN PATENT DOCUMENTS

| | | | |
|---|---|---|---|
| JP | 2002-155120 | A | 5/2002 |
| JP | 2002-201152 | A | 7/2002 |
| JP | 2003-238620 | A | 8/2003 |
| JP | 2005-99856 | A | 4/2005 |
| JP | 2005-150335 | A | 6/2005 |
| JP | 2007-318024 | A | 12/2007 |
| JP | 2011-180269 | | 9/2011 |
| JP | 2012-74616 | A | 4/2012 |
| JP | 2012-209290 | A | 10/2012 |
| JP | 2013-105950 | | 5/2013 |

OTHER PUBLICATIONS

Japanese-language Written Opinion (PCT/ISA/237) issued in PCT Application No. PCT/JP2014/068663 dated Oct. 14, 2014 (seven pages).
U.S. Appl. No. 14/905,451, filed Jan. 15, 2016.

* cited by examiner

FILM-FORMING COMPOSITION, FILM FORMED THEREBY, AND METHOD FOR MANUFACTURING ORGANIC SEMICONDUCTOR ELEMENT USING SAME

FIELD OF THE INVENTION

The present invention relates to a film-forming composition for forming a film on an organic semiconductor film. The present invention also relates to a film formed from the film-forming composition and a method for manufacturing an organic semiconductor element using such a film.

BACKGROUND ART

Organic semiconductor materials are organic substances having the properties of semiconductors. There are known various organic semiconductor materials and organic charge-transfer materials, including: organic low-molecular compounds such as pentacene, anthracene, tetracene and phthalocyanine; polyacetylene-based conductive polymers; polyphenylene-based conductive polymers such as polyparaphenylene and derivatives thereof, polyphenylene vinylene and derivatives thereof and the like; heterocyclic conductive polymers such as polypyrrole and derivatives thereof, polythiophene and derivatives thereof, polyfuran and derivatives thereof and the like; and ionic conductive polymers such as polyaniline and derivatives thereof. In particular, some organic semiconductor materials e.g. organic low-molecular semiconductor and polythiophene can be applied as films to organic substrates e.g. organic polymer substrates by wet processes. It is feasible to manufacture flexible organic electrochromic displays by processing such organic semiconductor films into semiconductor circuits on the organic substrate materials.

The manufacturing of semiconductor elements involves fine processing (sometimes referred to as "pattern processing") of semiconductor films into desired semiconductor circuits. At this time, coating films are applied to protect the semiconductor films during the fine processing or to protect the circuit patterns after the fine processing.

It is often the case to process the semiconductor film into a circuit pattern by means of a photolithography process. The photolithography process is a technique to apply a photosensitive material (called "resist") to a substrate, exposing the resist-coated substrate through a photomask or reticle and form a pattern of exposed and unexposed resist regions. The semiconductor film is processed into a circuit pattern by forming a resist pattern through exposure and development of the resist film, and then, dry-etching or wet-etching the semiconductor film.

In the manufacturing of the organic semiconductor element, it is conceivable to form a pattern on the organic semiconductor film by a print process such as relief printing, intaglio printing, planographic printing or screen printing or an imprint process in place of the photolithography process and etch the organic semiconductor film through the pattern. Herein, the imprint process is a technique to apply a coating film to a substrate, allowing a die having a fine pattern of projections and depressions to be pressed against the coating film and thereby transfer the pattern of the die to the coating film.

During the pattern processing of the organic semiconductor film by wet etching, a coating film is applied to the organic semiconductor film such that the organic semiconductor film can be protected from an etchant solvent. It is required that a film-forming composition for forming such a protection film satisfies two important conditions. The first condition is that the film-forming composition is soluble in a solvent that does not cause dissolution or swelling of the organic semiconductor film and thus can be applied to the organic semiconductor film by a wet process. The second condition is that, during the pattern processing of the organic semiconductor film, the wet-coating film can protect the organic semiconductor film from etching. However, it has been difficult to obtain film-forming composition satisfying both of these two conditions.

There are two etching processes: one is a dry etching process using plasma irradiation in a vacuum device; and the other is a wet etching process using a solvent as an etchant. The wet etching process is convenient for etching of the organic semiconductor film because the organic semiconductor film is soluble in the etchant. In general, the organic semiconductor film has an aromatic ring group or heterocyclic group in its structure and can readily be dissolved in an aromatic solvent such as benzene, toluene and xylene.

For example, Patent Documents 1 and 2 disclose film-forming compositions and films formed therefrom such that the films have high etchant resistance and remain unaffected by etchants during the etching of organic semiconductor films into semiconductor circuit patterns.

More specifically, Patent Document 1 discloses a method for manufacturing an organic semiconductor element with stable electrical characteristics and an organic semiconductor element manufactured thereby, wherein, during the manufacturing of the organic semiconductor element, a coating film is formed on an organic semiconductor film by the application of a liquid film-forming composition containing at least one organic solvent selected from propylene carbonate, acetonitrile and dimethyl sulfoxide and an organic compound soluble in the organic solvent.

Patent Document 2 discloses a photosensitive resin composition for forming a coating film with high photoreactivity, good patterning property, high hydrophobicity and good dielectric characteristics, a thin film formed therefrom and a pattern formation method thereof, wherein the photosensitive resin composition contains a solvent such as alcohol, hydrocarbon, halogenated hydrocarbon, ether, ester, ketone, cellosolve, carbitol, glycol ether ester, amide, sulfoxide or nitrile.

However, it can hardly be said that the organic solvent of the film-forming composition of Patent Document 1 and the solvent of the photosensitive resin composition of Patent Document 2 do not affect organic semiconductor films. There has thus been a demand for a film-forming composition and a film formed therefrom that can be applied to an organic semiconductor film, without affecting the organic semiconductor film, and can be patterned by e.g. a photolithography process or imprint process.

Furthermore, Patent Document 3 discloses a positive resist composition for use by exposure to vacuum ultraviolet laser radiation, comprising: an acrylic resin capable of changing its solubility in an alkaline aqueous solution by the action of an acid; and an acid generator, wherein the acrylic resin contains a polymer having an acrylic ester or methacrylic ester moiety with a fluorine-containing ester group.

Patent Document 4 discloses a positive resist composition for use by exposure to vacuum ultraviolet laser radiation of 1 nm to 190 nm wavelength, comprising: an acrylic resin capable of changing its solubility in an alkaline aqueous solution by the action of an acid; and an acid generator, wherein the acrylic resin has a unit obtained by polymerization of fluoroalkyl methacrylate.

PRIOR ART DOCUMENTS

Patent Documents

Patent Document 1: Japanese Laid-Open Patent Publication No. 2012-74616
Patent Document 2: Japanese Laid-Open Patent Publication No. 2011-180269
Patent Document 3: Japanese Laid-Open Patent Publication No. 2001-154362
Patent Document 3: Japanese Laid-Open Patent Publication No. 2005-99856

SUMMARY OF THE INVENTION

Problems to be Solved by the Invention

It is accordingly an object of the present invention to provide a film that can be applied to an organic semiconductor film, without affecting the organic semiconductor film, can be patterned by a photolithography process or imprint process etc. and does not become affected by an etchant during the wet etching of the organic semiconductor film into a semiconductor circuit pattern. It is also an object of the present invention to provide a film-forming composition for forming such a film and a method for manufacturing an organic semiconductor element using such a film.

Means for Solving the Problems

As a result of extensive researches, the present inventors have found that a fluorine-containing solvent such as fluorine-containing hydrocarbon or fluorine-containing ether, when applied by a wet process, causes less influence such as dissolution or swelling of an organic semiconductor film as compared to the solvents of Patent Documents 1 and 2. Based on this finding, the present inventors have further searched for a fluororesin that is soluble in a fluorine-containing solvent such as fluorine-containing hydrocarbon or fluorine-containing ether and unaffected by an etchant during the etching of an organic semiconductor film into a circuit pattern, and then, have resultantly found out a fluororesin for forming a fluororesin film on an organic semiconductor film and a fluorine-containing solvent for dissolving such a fluororesin and obtained a film-forming composition containing the fluororesin and the fluorine-containing solvent. The present invention has been accomplished by these efforts.

The present invention provides a film-forming composition for forming a fluororesin film on an organic semiconductor film, comprising: a fluorine-containing solvent that causes significantly less dissolution or swelling of organic semiconductor film; and a specific fluororesin soluble in the fluorine-containing solvent and having good etchant resistance. The present invention also provides a film formed from such a film-forming composition and a method for manufacturing an organic semiconductor element using such a film. The film-forming composition of the present invention can be applied by a wet process to an organic semiconductor film on an inorganic substrate or organic polymer substrate so as to form the fluororesin film on the organic semiconductor film without affecting the organic semiconductor film and the organic polymer substrate. The fluororesin film can be patterned by e.g. a lithography process, print process or imprint process. As the fluororesin film is difficult to dissolve in a hydrocarbon or aromatic solvent such as benzene, toluene or xylene used as an etchant for etching of the organic semiconductor film, the organic semiconductor film can be etched through the pattern of the fluororesin film. The fluororesin film is thus suitably applicable to the manufacturing of the organic semiconductor element.

Namely, the present invention includes the following aspects 1 to 23.

[Inventive Aspect 1]

A film-forming composition for forming a fluororesin film on an organic semiconductor film, comprising:
a fluororesin having a repeating unit of the general formula (1)

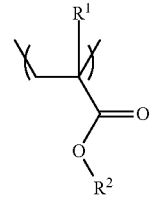

(1)

where $R^1$ each independently represents a hydrogen atom, a fluorine atom, a methyl group or a trifluoromethyl group; and $R^2$ each independently represents a $C_1$-$C_{15}$ straight, $C_3$-$C_{15}$ branched or $C_3$-$C_{15}$ cyclic fluorine-containing hydrocarbon group in which any hydrogen atom may be replaced by a fluorine atom with the proviso that the repeating unit contains at least one fluorine atom; and
a fluorine-containing solvent.

[Inventive Aspect 2]

The film-forming composition according to Inventive Aspect 1, wherein the fluorine-containing solvent includes either a fluorine-containing hydrocarbon or a fluorine-containing ether.

[Inventive Aspect 3]

The film-forming composition according to Inventive Aspect 2, wherein the fluorine-containing solvent includes, as the fluorine-containing hydrocarbon, a $C_4$-$C_8$ straight, branched or cyclic hydrocarbon in which at least one hydrogen atom is replaced by a fluorine atom.

[Inventive Aspect 4]

The film-forming composition according to Inventive Aspect 2, wherein the fluorine-containing solvent includes, as the fluorine-containing ether, a fluorine-containing ether of the general formula (2)

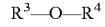

(2)

where $R^3$ and $R^4$ each independently represent a $C_1$-$C_{15}$ straight, $C_3$-$C_{15}$ branched or $C_3$-$C_{15}$ cyclic hydrocarbon group; at least one hydrogen atom of the ether is replaced by a fluorine atom.

[Inventive Aspect 5]

The film-forming composition according to any one of Inventive Aspects 1 to 4, wherein the fluorine-containing solvent further includes a fluorine-containing alcohol of the general formula (3)

(3)

where $R^5$ represents a $C_1$-$C_{15}$ straight, $C_3$-$C_{15}$ branched or $C_3$-$C_{15}$ cyclic hydrocarbon group in which at least one hydrogen atom is replaced by a fluorine atom.

[Inventive Aspect 6]

The film-forming composition according to any one of Inventive Aspects 1 to 5, wherein the fluororesin has a fluorine content of 30 to 65 mass %.

[Inventive Aspect 7]

The film-forming composition according to any one of Inventive Aspects 1 to 6, wherein the fluorine-containing solvent has a fluorine content of 50 to 70 mass %.

[Inventive Aspect 8]

A fluororesin film formed by applying the film-forming composition according to any one of Inventive Aspects 1 to 7 onto an organic semiconductor film.

[Inventive Aspect 9]

A manufacturing method of an organic semiconductor element, comprising:

applying the film-forming composition according to any one of Inventive Aspects 1 to 7 onto an organic semiconductor film, thereby forming a fluororesin film;

patterning the fluororesin film; and etching the organic semiconductor film into a pattern.

[Inventive Aspect 10]

The manufacturing method according to Inventive Aspect 9, wherein the patterning of the fluororesin film is performed by a photolithography process.

[Inventive Aspect 11]

The manufacturing method according to Inventive Aspect 9, wherein the patterning of the fluororesin film is performed by a print process.

[Inventive Aspect 12]

The manufacturing method according to Inventive Aspect 9, wherein the patterning of the fluororesin film is performed by an imprint process.

[Inventive Aspect 13]

The manufacturing method according to any one of Inventive Aspects 9 to 12, wherein the etching of the organic semiconductor film is performed by a wet etching process using an aromatic solvent.

[Inventive Aspect 14]

The manufacturing method according to Inventive Aspect 13, wherein the aromatic solvent is benzene, toluene or xylene.

[Inventive Aspect 15]

The manufacturing method according to any one of Inventive Aspects 9 to 14, further comprising: removing the fluororesin film.

[Inventive Aspect 16]

The manufacturing method according to Inventive Aspect 15, wherein the removing of the fluororesin film is performed by dissolving the fluororesin film in a fluorine-containing solvent.

[Inventive Aspect 17]

The manufacturing method according to Inventive Aspect 16, wherein the fluorine-containing solvent includes either a fluorine-containing hydrocarbon or a fluorine-containing ether.

[Inventive Aspect 18]

The manufacturing method according to Inventive Aspect 17, wherein the fluorine-containing solvent includes, as the fluorine-containing hydrocarbon, a $C_4$-$C_8$ straight, branched or cyclic hydrocarbon in which at least one hydrogen atom is replaced by a fluorine atom.

[Inventive Aspect 19]

The manufacturing method according to Inventive Aspect 17, wherein the fluorine-containing solvent includes, as the fluorine-containing ether, a fluorine-containing ether of the general formula (2)

$$R^3\text{—O—}R^4 \qquad (2)$$

where $R^3$ and $R^4$ each independently represents a $C_1$-$C_{15}$ straight, $C_3$-$C_{15}$ branched or $C_3$-$C_{15}$ cyclic hydrocarbon group; and at least one hydrogen atom of the ether is replaced by a fluorine atom.

[Inventive Aspect 20]

The manufacturing method according to any one of Inventive Aspects 16 to 19, wherein the fluorine-containing solvent further includes a fluorine-containing alcohol of the general formula (3)

$$R^5\text{—OH} \qquad (3)$$

where $R^5$ represents a $C_1$-$C_{15}$ straight, $C_3$-$C_{15}$ branched or $C_3$-$C_{15}$ cyclic hydrocarbon group in which at least one hydrogen atom is replaced by a fluorine atom.

[Inventive Aspect 21]

An organic semiconductor element manufactured by the manufacturing method according to any one of Inventive Aspects 9 to 20.

[Inventive Aspect 22]

An organic electroluminescence display comprising the organic semiconductor element according to Inventive Aspect 21.

[Inventive Aspect 23]

A liquid crystal display comprising the organic semiconductor element according to Inventive Aspect 21.

The film-forming composition of the present invention, when applied to an organic semiconductor film, does not affect the organic semiconductor film by dissolution or swelling. The fluororesin film can be thus formed from the film-forming composition on the organic semiconductor film by a wet process. Further, the fluororesin film can be patterned by a photolithography process, print process or imprint process and remain unaffected by the etchant such as hydrocarbon solvent or aromatic solvent during the wet etching of the organic semiconductor film.

When the film-forming composition of the present invention is applied to an organic semiconductor film, the fluorine-containing solvent of the film-forming composition does not cause dissolution or swelling of the organic semiconductor film. The fluororesin film can be thus formed from the film-forming composition on the organic material by a wet process. Further, the fluororesin film can be patterned by a photolithography process, print process or imprint process and does not become affected by the etchant such as hydrocarbon solvent or aromatic solvent during the wet etching of the organic semiconductor film.

In this way, it is possible by using the film-forming composition of the present invention to form a semiconductor circuit pattern by fine processing of the organic semiconductor film on the substrate. The film-forming composition of the present invention is therefore suitably usable for the manufacturing of the organic semiconductor element.

BRIEF DESCRIPTION OF THE DRAWINGS

FIG. 1A shows a workpiece in which an organic semiconductor film is formed on a substrate; FIG. 1B shows the workpiece after the formation of a fluororesin film on the organic semiconductor film; FIG. 1C shows the workpiece after the patterning of the fluororesin film; FIG. 1D shows the workpiece after the wet etching of the organic semiconductor film; and FIG. 1E shows the workpiece after the removal of the fluorine film.

DETAILED DESCRIPTION OF THE EMBODIMENTS

Figure 1A:
FIGS. 1A-1E are a schematic view of a manufacturing method of an organic semiconductor element using a film-forming composition, where

Hereinafter, a film-forming composition of the present invention and a manufacturing method of an organic semiconductor element using the film-forming composition will be described below.

The film-forming composition of the present invention includes not only a fluororesin for formation of a film but also a fluorine-containing solvent for application as a solution.

1. Fluororesin

In the film-forming composition of the present invention, the fluororesin has a repeating unit of the general formula (1).

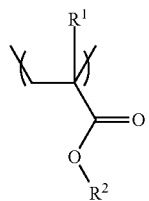
(1)

In the general formula (1), $R^1$ each independently represents a hydrogen atom, a fluorine atom, a methyl group or a trifluoromethyl group; and $R^2$ each independently represents a $C_1$-$C_{15}$ straight, $C_3$-$C_{15}$ branched or $C_3$-$C_{15}$ cyclic hydrocarbon group in which any hydrogen atom may be replaced by a fluorine with the proviso that the repeating unit contains at least one fluorine atom.

As the repeating unit (1) contains a fluorine atom, the fluororesin has compatibility with the fluorine-containing solvent. The coating film of the fluororesin has high flexibility and can attain flatness without cracking as the repeating unit (1) has a polar ester bond group adjacent to the main chain. Further, the fluororesin has not only high solubility in the fluorine-containing solvent but also high resistance to an etching solvent as the repeating unit has a fluorinated hydrocarbon group on the side chain.

For ease of monomer synthesis, $R^2$ is preferably a $C_2$-$C_{14}$ straight or $C_3$-$C_6$ branched hydrocarbon group in which at least one hydrogen atom is replaced by a fluorine atom.

Specific examples of the straight hydrocarbon group as $R^2$ are methyl, ethyl, propyl, butyl, pentyl, hexyl, heptyl, octyl, nonyl and $C_{10}$-$C_{14}$ straight hydrocarbon groups. In $R^2$, any of hydrogen atoms on carbon atoms, except that directly bonded to oxygen, may be replaced by a fluorine atom.

As the straight hydrocarbon group $R^2$, particularly preferred is a group of the general formula (4).

(4)

In the general formula (4), X represents a hydrogen atom or a fluorine atom; n is an integer of 1 to 4; and m is an integer of 1 to 14.

For ease of monomer synthesis, n is preferably an integer of 1 to 2 for ease of monomer synthesis.

Specific examples of the branched hydrocarbon group as $R^2$ are 1,1,1,3,3,3-hexafluoroisopropyl, 1-(trifluoromethyl)-2,2,3,3,3-pentafluoropropyl, 1,1-bis(trifluoromethyl)-2,2,2-trifluoroethyl and 1,1-bis(trifluoromethyl)ethyl.

In the film-forming composition of the present invention, the fluororesin has one kind, or two or more kinds, of the repeating unit of the general formula (1). The fluororesin may has any repeating unit other than the repeating unit of the general formula (1).

The fluororesin is obtained by e.g. polymerization of an acrylic acid ester derivative of the general formula (5) as a monomer.

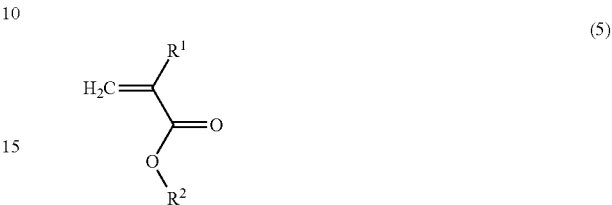
(5)

In the general formula (5), $R^1$ and $R^2$ have the same definitions as those in the general formula (1).

There is no particular limitation on the acrylic acid ester derivative as the monomer as long as it is represented by the general formula (5).

In the case where $R^2$ is a branched hydrocarbon group in the general formula (5), there can preferably be used an acrylate, methacrylate, α-fluoromethacrylate or α-trifluoromethylacrylate derived from 1,1,1,3,3,3-hexafluoropropane-2-ol ($CF_3CH(OH)CF_3$), 1,1,1,3,3,4,4,4-octafluorobutane-2-ol ($CF_3CH(OH)CF_2CF_3$), 2-trifluoromethyl-1,1,1,3,3-hexafluoropropane-2-ol (($CF_3)_2COH$) or 2-trifluoromethyl-1,1,1-trifluoropropane-2-ol (($CF_3)_2(CH_3)COH$) as indicated below.

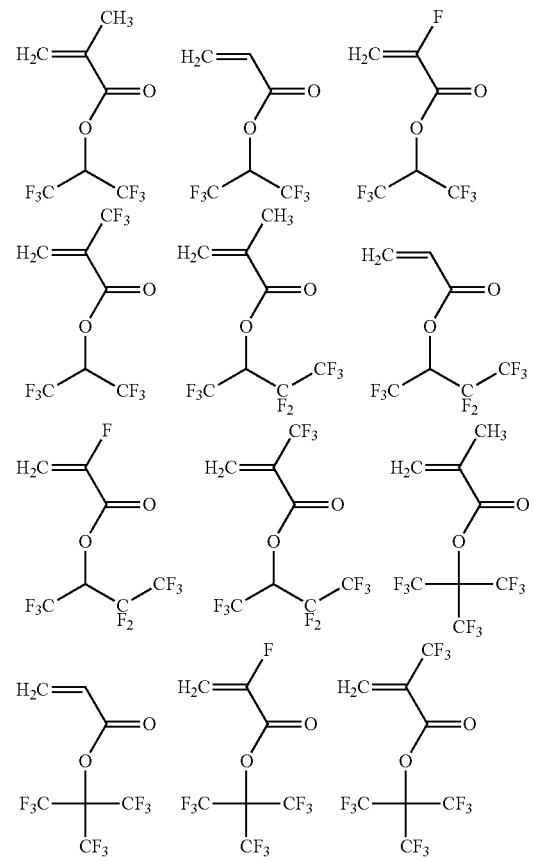

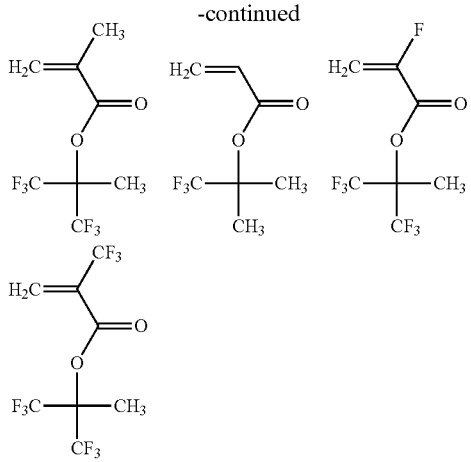

In the case where R² is a straight hydrocarbon group in the general formula (5), there can be used a monomer compound of the general formula (6).

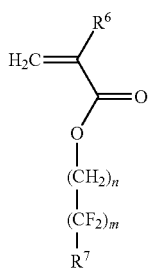

(6)

In the general formula (6), $R^6$ represents a hydrogen atom, a fluorine atom, a methyl group or a trifluoromethyl group; $R^7$ represents a hydrogen atom or a fluorine atom; n represents an integer of 1 to 4; and m represents an integer of 1 to 14.

For ease of monomer synthesis, n is preferably an integer of 1 to 3; and m is an integer of 1 to 14 in the general formula (6).

Further, $R^6$ is preferably a hydrogen atom or a methyl group for ease of monomer synthesis in the general formula (6).

It is preferable that the fluororesin, which is obtained by polymerization of the above monomer, has a fluorine content of 30 to 65 mass %, more preferably 40 to 55 mass %, based on the total mass of the fluororesin. The fluororesin is readily soluble in the fluorine-containing solvent when the fluorine content of the fluororesin is within the above specific range.

Furthermore, the fluororesin preferably has a weight-average molecular weight of 2,000 to 200,000, more preferably 3,000 to 15,000. When the molecular weight of the fluororesin is smaller than 2,000, the fluororesin may not have sufficient resistance to etching solvent. When the molecular weight of the fluororesin is greater than 200,000, it may become difficult to form the fluororesin film due to insufficient solubility of the fluororesin in the fluorine-containing solvent.

Preferred examples of the monomer compound of the general formula (6) are those having the following combinations of $R^6$, $R^7$, n and m. Among others, particularly preferred are those of No. 2-9, 11, 12, 15, 16 and 19 in TABLE 1, No. 40, 43, 44, 47-55, 57 and 58 in TABLE 2 and No. 85, 88, 91, 92, 94-103 and 105 in TABLE 3.

TABLE 1

| Examples of Repeating Unit | | | | |
|---|---|---|---|---|
| No. | n | m | $R^6$ | $R^7$ |
| 1 | 1 | 1 | F | H |
| 2 | 1 | 1 | $CF_3$ | H |
| 3 | 1 | 1 | $CH_3$ | F |
| 4 | 1 | 1 | H | F |
| 5 | 1 | 1 | F | F |
| 6 | 1 | 1 | $CF_3$ | F |
| 7 | 1 | 2 | $CH_3$ | H |
| 8 | 1 | 2 | H | H |
| 9 | 1 | 2 | F | H |
| 10 | 1 | 2 | $CF_3$ | H |
| 11 | 1 | 2 | $CH_3$ | F |
| 12 | 1 | 2 | H | F |
| 13 | 1 | 2 | F | F |
| 14 | 1 | 2 | $CF_3$ | F |
| 15 | 1 | 4 | $CH_3$ | H |
| 16 | 1 | 4 | H | H |
| 17 | 1 | 4 | F | H |
| 18 | 1 | 4 | $CF_3$ | H |
| 19 | 1 | 4 | $CH_3$ | F |
| 20 | 1 | 4 | H | F |
| 21 | 1 | 4 | F | F |
| 22 | 1 | 4 | $CF_3$ | F |
| 23 | 1 | 6 | $CH_3$ | H |
| 24 | 1 | 6 | H | H |
| 25 | 1 | 6 | F | H |
| 26 | 1 | 6 | $CF_3$ | H |
| 27 | 1 | 6 | $CH_3$ | F |
| 28 | 1 | 6 | H | F |
| 29 | 1 | 6 | F | F |
| 30 | 1 | 6 | $CF_3$ | F |
| 31 | 1 | 8 | $CH_3$ | H |
| 32 | 1 | 8 | H | H |
| 33 | 1 | 8 | F | H |
| 34 | 1 | 8 | $CH_3$ | F |
| 35 | 1 | 8 | H | F |
| 36 | 1 | 10 | $CH_3$ | H |
| 37 | 1 | 10 | H | H |
| 38 | 1 | 10 | $CH_3$ | F |

TABLE 2

| No. | n | m | $R^6$ | $R^7$ |
|---|---|---|---|---|
| 39 | 2 | 1 | F | H |
| 40 | 2 | 1 | $CF_3$ | H |
| 41 | 2 | 1 | $CH_3$ | F |
| 42 | 2 | 1 | H | F |
| 43 | 2 | 1 | F | F |
| 44 | 2 | 1 | $CF_3$ | F |
| 45 | 2 | 2 | $CH_3$ | H |
| 46 | 2 | 2 | H | H |
| 47 | 2 | 2 | F | H |
| 48 | 2 | 2 | $CF_3$ | H |
| 49 | 2 | 2 | $CH_3$ | F |
| 50 | 2 | 2 | H | F |
| 51 | 2 | 2 | F | F |
| 52 | 2 | 2 | $CF_3$ | F |
| 53 | 2 | 4 | $CH_3$ | H |
| 54 | 2 | 4 | H | H |
| 55 | 2 | 4 | F | H |
| 56 | 2 | 4 | $CF_3$ | H |
| 57 | 2 | 4 | $CH_3$ | F |
| 58 | 2 | 4 | H | F |
| 59 | 2 | 4 | F | F |
| 60 | 2 | 4 | $CF_3$ | F |
| 61 | 2 | 6 | $CH_3$ | H |
| 62 | 2 | 6 | H | H |
| 63 | 2 | 6 | F | H |
| 64 | 2 | 6 | $CF_3$ | H |
| 65 | 2 | 6 | $CH_3$ | F |

TABLE 2-continued

| No. | n | m | R⁶ | R⁷ |
|---|---|---|---|---|
| 66 | 2 | 6 | H | F |
| 67 | 2 | 6 | F | F |
| 68 | 2 | 6 | CF$_3$ | F |
| 69 | 2 | 8 | CH$_3$ | H |
| 70 | 2 | 8 | H | H |
| 71 | 2 | 8 | F | H |
| 72 | 2 | 8 | CF$_3$ | H |
| 73 | 2 | 8 | CH$_3$ | F |
| 74 | 2 | 8 | H | F |
| 75 | 2 | 8 | F | F |
| 76 | 2 | 10 | CF$_3$ | F |
| 77 | 2 | 10 | CH$_3$ | H |
| 78 | 2 | 10 | H | H |
| 79 | 2 | 10 | F | H |
| 80 | 2 | 10 | CH$_3$ | F |
| 81 | 2 | 12 | H | F |
| 82 | 2 | 12 | CH$_3$ | H |
| 83 | 2 | 12 | CH$_3$ | F |

TABLE 3

| No. | n | m | R⁶ | R⁷ |
|---|---|---|---|---|
| 84 | 3 | 1 | F | H |
| 85 | 3 | 1 | CF$_3$ | H |
| 86 | 3 | 1 | H | F |
| 87 | 3 | 1 | F | F |
| 88 | 3 | 1 | CF$_3$ | F |
| 89 | 3 | 2 | CH$_3$ | H |
| 90 | 3 | 2 | H | H |
| 91 | 3 | 2 | F | H |
| 92 | 3 | 2 | CF$_3$ | H |
| 93 | 3 | 2 | CH$_3$ | F |
| 94 | 3 | 2 | H | F |
| 95 | 3 | 2 | F | F |
| 96 | 3 | 2 | CF$_3$ | F |
| 97 | 3 | 4 | CH$_3$ | H |
| 98 | 3 | 4 | H | H |
| 99 | 3 | 4 | F | H |
| 100 | 3 | 4 | CF$_3$ | H |
| 101 | 3 | 4 | CH$_3$ | F |
| 102 | 3 | 4 | H | F |
| 103 | 3 | 4 | F | F |
| 104 | 3 | 4 | CF$_3$ | F |
| 105 | 3 | 6 | CH$_3$ | H |
| 106 | 3 | 6 | H | H |
| 107 | 3 | 6 | F | H |
| 108 | 3 | 6 | CF$_3$ | H |
| 109 | 3 | 6 | CH$_3$ | F |
| 110 | 3 | 6 | H | F |
| 111 | 3 | 6 | F | F |
| 112 | 3 | 6 | CF$_3$ | F |
| 113 | 3 | 8 | CH$_3$ | H |
| 114 | 3 | 8 | H | H |
| 115 | 3 | 8 | F | H |
| 116 | 3 | 8 | CF$_3$ | H |
| 117 | 3 | 8 | CH$_3$ | F |
| 118 | 3 | 8 | H | F |
| 119 | 3 | 8 | F | F |
| 120 | 3 | 8 | CF$_3$ | F |
| 121 | 3 | 10 | CH$_3$ | H |
| 122 | 3 | 10 | H | H |
| 123 | 3 | 10 | F | H |
| 124 | 3 | 10 | CF$_3$ | H |
| 125 | 3 | 10 | CH$_3$ | F |
| 126 | 3 | 10 | H | F |
| 127 | 3 | 10 | F | F |
| 128 | 3 | 12 | CH$_3$ | H |
| 129 | 3 | 12 | H | H |
| 130 | 3 | 12 | F | H |
| 131 | 3 | 12 | CH$_3$ | F |
| 132 | 3 | 12 | H | F |
| 133 | 3 | 14 | CH$_3$ | H |

For use in the film-forming composition of the present invention, the fluororesin can be obtained by polymerization of one kind, or two or more kinds, of the monomer of the general formula (5).

Any monomer other than the monomer of the general formula (5) may be added to the raw material within the range that does not impair the solubility of the fluororesin in the fluorine-containing solvent. The amount of the other monomer added is preferably 10 mass % or less based on the total mass of the fluororesin.

As such other monomer, there can be used an α-substituted or unsubstituted acrylic ester, α-olefin, fluorine-containing olefin or carboxylic acid vinyl ester. This other monomer may have at least one hydrogen atom replaced by fluorine. Specific examples of the acrylic ester are methyl ester, ethyl ester, propyl ester, isopropyl ester, butyl ester, isobutyl ester, tert-butyl ester, pentyl ester, isopentyl ester, hexyl ester, cyclohexyl ester, cyclohexyl methyl ester, 2-hydroxy ethyl ester, 2-hydroxy propyl ester, 3-hydroxy propyl ester, 4-hydroxy cyclohexyl ester, 4-(hydroxymethyl)cyclohexyl methyl ester, bornyl ester, isobornyl ester, norbornyl ester, methoxymethyl ester, methoxyethyl ester, ethoxyethyl ester, ethoxyethoxyethyl ester and methoxyethoxyethyl ester of acrylic acid, methacrylic acid, α-fluoroacrylic acid or α-trifluoromethylacrylic acid. Specific examples of the carboxylic acid vinyl ester are vinyl acetate, vinyl propionate, vinyl butyrate, vinyl caproate, vinyl laurate, vinyl palmitate, vinyl stearate, vinyl pivalate, vinyl chloroacetate, vinyl methacrylate and vinyl benzoate.

Preferred examples of the fluororesin used in the film-forming composition of the present invention are those having at least one of the following repeating units.

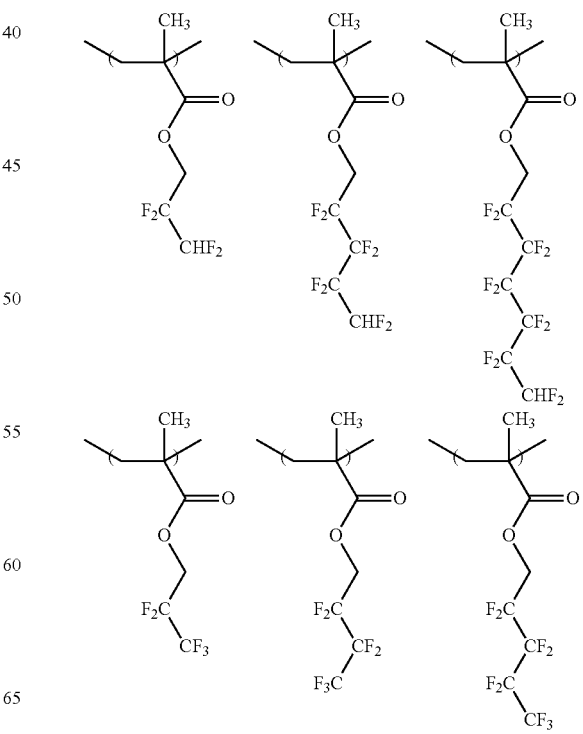

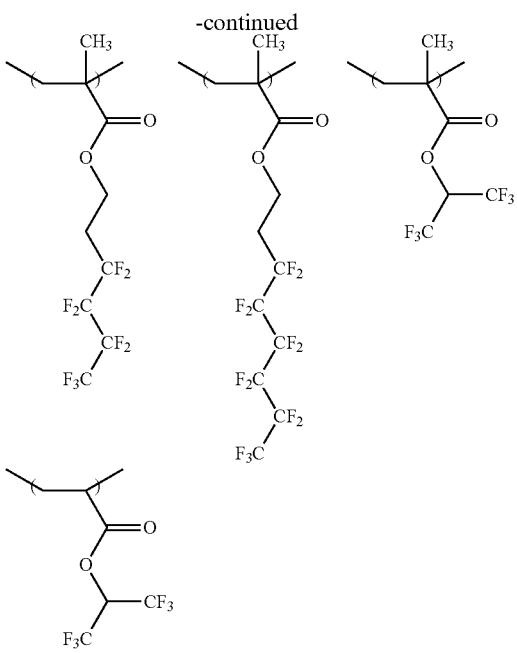

[Polymerization Method and Purification Method]

For preparation of the fluororesin, the polymerization of the monomers can be performed by e.g. a commonly known radical polymerization process and, more specifically, by using a radical initiator such as azo compound, peroxide, persulfuric acid compound or redox compound as an initiator of the radical reaction.

It is feasible to perform the polymerization by the use of a solvent in combination with the monomers and the polymerization initiator. Various organic compounds can be used as the polymerization solvent. Examples of the polymerization solvent are: esters such as ethyl acetate, butyl acetate and propylene glycol monomethylether acetate; ketones such as acetone, 2-butanone and cyclohexanone; ethers such as diisopropyl ether, dibutyl ether and tetrahydrofuran; aromatic hydrocarbons such as benzene and toluene; and hydrocarbons such as hexane, heptane and cyclohexane. In each of these solvents, at least one hydrogen atom may be replaced by halogen. The fluorine-containing solvent usable as the solvent of the film-forming composition can also be used as the polymerization solvent.

The concentration of the monomer during the polymerization is preferably in the range of 1 to 95 mass %, more preferably 10 to 80 mass %, based on the total mass of the reaction system. When the concentration of the monomer is lower than 1 mass %, the reaction rate of the polymerization may be lowered. When the concentration of the monomer exceeds 80 mass %, it may become difficult to prepare the fluororesin due to increase in the viscosity of the polymerization solution.

It is preferable to reduce remaining unreacted monomer by purification after the reaction. The purification can be performed by distillation of the remaining monomer under a reduced pressure or under heating, reprecipitation using a poor solvent, liquid-liquid extraction of the polymerization solution or washing the solid polymerization product by stirring in a solvent. These purification techniques can be used in any combination thereof.

2. Fluorine-Containing Solvent

In the film-forming composition of the present invention, the fluorine-containing solvent preferably includes a fluorine-containing hydrocarbon or a fluorine-containing ether.

It is preferable that the fluorine-containing solvent includes, as the fluorine-containing hydrocarbon, a $C_4$-$C_8$ straight, branched or cyclic hydrocarbon in which at least one hydrogen atom is replaced by a fluorine atom.

Further, it is preferable that the fluorine-containing solvent includes, as the fluorine-containing ether, a fluorine-containing ether of the general formula (2).

$$R^3\text{—O—}R^4 \tag{2}$$

In the general formula (2), $R^3$ and $R^4$ each independently represent a $C_1$-$C_{15}$ straight, $C_3$-$C_{15}$ branched or $C_3$-$C_{15}$ cyclic hydrocarbon group; and at least one hydrogen atom of the ether is replaced by a fluorine atom.

The fluorine-containing solvent may preferably further include a fluorine-containing alcohol of the general formula (3).

$$R^5\text{—OH} \tag{3}$$

In the general formula (3), $R^5$ represents a $C_1$-$C_{15}$ straight, $C_3$-$C_{15}$ branched or $C_3$-$C_{15}$ cyclic hydrocarbon group in which at least one hydrogen atom is replaced by a fluorine atom.

As the fluorine-containing solvent, there can be used any fluorine-containing solvent capable of dissolving the fluororesin in the film-forming composition of the present invention. There is no particular limitation on the fluorine content of the fluorine-containing solvent. In order for the fluorine-containing solvent to quickly dissolve the fluororesin, the fluorine content of the fluorine-containing solvent is generally 50 to 70 mass %, preferably 55 to 70 mass %, based on the total mass of the fluorine-containing solvent. When the fluorine content of the fluorine-containing solvent exceeds 70 mass %, the fluororesin may not be sufficiently dissolved in the fluorine-containing solvent. When the fluorine content of the fluorine-containing solvent is less than 50 mass %, there may occur surface dissolution or swelling of an organic semiconductor film during the application or printing of the film-forming composition onto the organic semiconductor film. The following fluorine-containing hydrocarbon or fluorine-containing ether can suitably be used as the fluorine-containing solvent in the film-forming composition of the present invention.

[Fluorine-Containing Hydrocarbon]

The fluorine-containing hydrocarbon is low in ozone depletion potential and thus is suitably usable as the fluorine-containing solvent in the film-forming composition of the present invention. In particular, the $C_4$-$C_8$ straight, branched or cyclic hydrocarbon having at least one hydrogen atom replaced by fluorine is preferred for ease of application of the film-forming composition.

As such a fluorine-containing hydrocarbon, there can be used any obtained by replacing at least one hydrogen atom of butane, pentane, hexane, heptane, octane, cyclopentane, cyclohexane etc. by a fluorine atom. Specific examples of the fluorine-containing hydrocarbon solvent are $CH_3CF_2CH_2CF_3$, $CF_3CHFCHFCF_2CF_3$, $CF_3CF_2CF_2CF_2CF_2CH_2CH_2CH_3$ and a fluorine-containing hydrocarbon of the following formula.

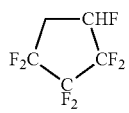

The fluorine-containing hydrocarbon needs to have a boiling point higher than the temperature of a substrate during the application of the film-forming composition. The boiling point of the fluorine-containing hydrocarbon is preferably 20° C. or more higher, more preferably 50° C. or more higher, than the application temperature. When the boiling point of the fluorine-containing hydrocarbon is lower than the substrate temperature during the application of the film-forming composition, it becomes difficult to form the film with sufficient flatness due to rapid evaporation of the fluorine-containing hydrocarbon during the application of the film-forming composition. The boiling point of the fluorine-containing hydrocarbon is preferably 200° C. or lower, more preferably 180° C. or lower. When the boiling point of the fluorine-containing hydrocarbon is 200° C. or lower, it is easy to evaporate and remove the fluorine-containing hydrocarbon by heating from the coating film of the film-forming composition.

The following are examples of the fluorine-containing hydrocarbon having a preferable boiling point.

$CF_3CHFCHFCF_2CF_3$ (Vertrel H manufactured by Du Pont-Mitsui Fluorochemicals Co., Ltd., boiling point: 55° C.)

Fluorine-containing hydrocarbon of the following formula (Zeorora H manufactured by Zeon Corporation, boiling point: 83° C.)

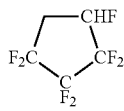

$CF_3CF_2CF_2CF_2CF_2CH_2CH_2CH_3$ (Asahiklin AC-6000 manufactured by Asahi Glass Co., Ltd., boiling point: 114° C.)

Herein, "Vertrel" is a trade name of fluorine-based solvent manufactured by Du Pont-Mitsui Fluorochemicals Co., Ltd.; "Zeorora" is a trade name of fluorine-based solvent (HFC) manufactured by Zeon Corporation; and "Asahiklin" is a trade name of fluorine-based solvent manufactured by Asahi Glass Co., Ltd. These trade names are registered as trademarks.

[Fluorine-Containing Ether]

The fluorine-containing ether is low in ozone depletion potential and global warming potential and thus is suitably usable as the fluorine-containing solvent. In particular, the fluorine-containing ether of the general formula (2) is preferred as the fluorine-containing solvent.

$$R^3-O-R^4 \quad (2)$$

In the general formula (2), $R^3$ represents a $C_1$-$C_{15}$ straight, $C_3$-$C_{15}$ branched or $C_3$-$C_{15}$ cyclic hydrocarbon group in which at least one hydrogen atom may be replaced by a fluorine atom; and $R^4$ represents a $C_1$-$C_{15}$ straight, $C_3$-$C_{15}$ branched or $C_3$-$C_{15}$ cyclic hydrocarbon group in which at least one hydrogen atom is replaced by a fluorine atom.

For high solubility of the fluororesin, it is preferable that the divalent groups $R^3$ and $R^4$ are not the same as each other in the general formula (2).

Specific examples of $R^3$ in the general formula (2) are methyl, ethyl, propyl, isopropyl, vinyl, allyl and methyl vinyl. This hydrocarbon group may have at least one hydrogen atom replaced by fluorine.

Specific examples of $R^4$ in the general formula (2) are those obtained by replacing at least one hydrogen atom of methyl, ethyl, propyl, isopropyl, butyl, isobutyl, sec-butyl, tert-butyl, 1-pentyl, 2-pentyl, 3-pentyl, 1-hexyl, 2-hexyl, 3-hexyl, 1-heptyl, 2-heptyl, 3-heptyl, 1-octyl, 2-octyl, 3-octyl, 1-nonyl, 2-nonyl, 1-decyl, 2-decyl, undecyl, dodecyl, cyclopentyl, cyclohexyl, cyclopentylmethyl, cyclohexylmethyl etc. by a fluorine atom. This hydrocarbon group may have an unsaturated bond.

The fluorine-containing ether needs to have a boiling point higher than the temperature of the substrate during the application of the film-forming composition. The boiling point of the fluorine-containing ether is preferably 20° C. or more higher, more preferably 50° C. or more higher, than the application temperature. When the boiling point of the fluorine-containing ether is lower than the substrate temperature during the application of the film-forming composition, it becomes difficult to form the film with sufficient flatness due to rapid evaporation of the fluorine-containing aliphatic ether during the application of the film-forming composition. The boiling point of the fluorine-containing ether is preferably 200° C. or lower, more preferably 180° C. or lower. When the boiling point of the fluorine-containing ether is 200° C. or lower, it is easy to evaporate and remove the fluorine-containing ether by heating from the coating film of the film-forming composition.

Preferred examples of the fluorine-containing ether are 1,1,2,3,3,3-hexafluoro-1-(2,2,2-trifluoroethoxy)propane, 1,1,2,3,3,3-hexafluoro-1-(2,2,3,3,3-pentafluoropropoxy) propane, 1,1,2,3,3,3-hexafluoro-1-(2,2,3,3-tetrafluoro-propoxy)propane and 2,2,3,3,3-pentafluoro-1-(1,1,2,2-tetra-fluoroethoxy)propane. These fluorine-containing ethers can be prepared by a method as disclosed in Japanese Laid-Open Patent Publication No. 2002-201152.

The following are examples of the fluorine-containing ether having a preferable boiling point.

$C_3F_7OCH_3$

$C_4F_9OCH_3$

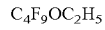
$C_4F_9OC_2H_5$

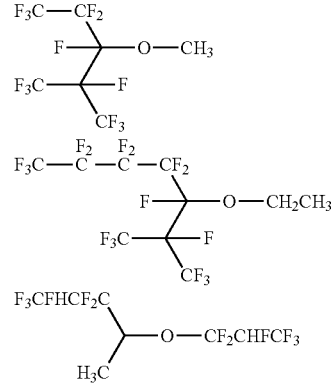

These ether compounds are commercially available under the trade names of Novec 7000, Novec 7100, Novec 7200, Novec 7300, Novec 7500 and Novec 7600 from Sumitomo 3M Limited and each can be used for the film-forming composition of the present invention. Herein, the trade name "Novec" is registered as a trademark.

As the fluorine-containing ether having a preferable boiling point, there can also be used those commercially available under the trade names of "Vertrel Sinera" and "Vertrel Suprion" from Du Pont-Mitsui Fluorochemicals Co., Ltd.

[Fluorine-Containing Alcohol]

In the film-forming composition of the present invention, the fluorine-containing solvent may include a fluorine-containing alcohol of the general formula (3) in addition to the fluorine-containing hydrocarbon or the fluorine-containing ether so as to further improve the solubility of the fluororesin in the fluorine-containing solvent. The fluorine-containing alcohol is preferably added in an amount of 45 mass % or less, more preferably 30 mass % or less.

$$R^5\text{—OH} \quad (3)$$

In the general formula (3), $R^4$ represents a $C_1$-$C_{15}$ straight, $C_3$-$C_{15}$ branched or $C_3$-$C_{15}$ cyclic hydrocarbon group in which at least one hydrogen atom is replaced by a fluorine atom.

It is preferable that, for high chemical stability, a fluorine atom is not substituted on a carbon atom adjacent to a hydroxyl group in the fluorine-containing alcohol of the general formula (3).

For ease of application of the film-forming composition, $R^3$ is preferably a $C_1$-$C_8$ straight, $C_3$-$C_{10}$ branched or $C_3$-$C_{10}$ cyclic hydrocarbon group having a larger number of fluorine atoms than that of hydrogen atoms in the fluorine-containing alcohol of the general formula (3).

Specific examples of the hydrocarbon group as $R^3$ are those obtained by replacing at least one hydrogen atom of methyl, ethyl, propyl, isopropyl, butyl, isobutyl, sec-butyl, tert-butyl, 1-pentyl, 2-pentyl, 3-pentyl, 1-hexyl, 2-hexyl, 3-hexyl, 1-heptyl, 2-heptyl, 3-heptyl, 1-octyl, 2-octyl, 3-octyl, cyclopentyl, cyclohexyl, cyclopentylmethyl, cyclohexylmethyl etc. by a fluorine atom.

It is preferable that the fluorine-containing alcohol of the general formula (3) has a larger number of fluorine atoms than that of hydrogen atoms for high solubility of the fluororesin.

Among the fluorine-containing alcohol of the general formula (3), a fluorine-containing alcohol of the general formula (7) or the general formula (8) is chemically stable and thus is more suitably usable in the film-forming composition of the present invention.

$$R^8\text{—CH}_2\text{—OH} \quad (7)$$

In the general formula (7), $R^8$ represents a $C_1$-$C_7$ straight or $C_3$-$C_9$ branched or cyclic fluorine-containing hydrocarbon group.

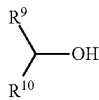
(8)

In the general formula (8), $R^9$ and $R^{10}$ each independently represents a $C_1$-$C_4$ straight, $C_3$-$C_6$ branched or $C_3$-$C_6$ cyclic hydrocarbon group having a larger number of fluorine atoms than that of hydrogen atoms.

Specific examples of $R^8$ in the general formula (7) are those obtained by replacing at least one hydrogen atom of methyl, ethyl, propyl, isopropyl, butyl, isobutyl, sec-butyl, tert-butyl, 1-pentyl, 2-pentyl, 3-pentyl, 1-hexyl, 2-hexyl, 3-hexyl, 1-heptyl, 2-heptyl, 3-heptyl, 2-octyl, 3-octyl, cyclopentyl, cyclohexyl, cyclopentylmethyl, cyclohexylmethyl etc. by a fluorine atom. Particularly preferred is the hydrocarbon group where the number of fluorine atoms is two or more larger than that of hydrogen atoms.

In the general formula (8), a $C_1$-$C_3$ straight hydrocarbon atom is preferred as $R^9$, $R^{10}$ for ease of synthesis. Specific examples of $R^9$, $R^{10}$ are those obtained by replacing at least one hydrogen atom of methyl, ethyl, propyl, isopropyl, butyl, isobutyl, sec-butyl, tert-butyl, 2-pentyl, 3-pentyl, 2-hexyl, 3-hexyl, cyclopentyl, cyclohexyl, cyclopentylmethyl etc. by a fluorine atom, where the number of fluorine atoms in the hydrocarbon group is larger than that of hydrogen atoms.

The fluorine-containing alcohol needs to have a boiling point higher than the temperature of the substrate during the application of the film-forming composition. The boiling point of the fluorine-containing alcohol is preferably 20° C. or more higher, more preferably 50° C. or more higher, than the application temperature. When the boiling point of the fluorine-containing alcohol is lower than the substrate temperature during the application of the film-forming composition, it becomes difficult to form the film with sufficient flatness due to rapid evaporation of the fluorine-containing aliphatic alcohol during the application of the film-forming composition. The boiling point of the fluorine-containing alcohol is preferably 200° C. or lower, more preferably 180° C. or lower. When the boiling point of the fluorine-containing alcohol is 200° C. or lower, it is easy to evaporate and remove the fluorine-containing alcohol by heating from the coating film of the film-forming composition.

Specific examples of the fluorine-containing alcohol having the above-ranged boiling point and used in the film-forming composition of the present invention are 1,1,1,3,3,3-hexafluoro-2-propanol, 2,2,2-trifluoroethanol, 2,2,3,3-tetrafluoropropanol, 2,2,3,3,3-pentafluoropropanol, 2,2,3,4,4,4-hexafluorobutanol, 2,2,3,3,4,4,4-heptafluorobutanol, 2,2,3,3,4,4,5,5-octafluoropentanol, 2,2,3,3,4,4,5,5,5-nonafluoropentanol, 3,3,4,4,5,5,6,6,6-notafluorohexanol, 2,2,3,3,4,4,5,5,6,6,7,7-dodecafluoroheptanol, 2,2,3,3,4,4,5,5,6,6,7,7,7-tridecafluoroheptanol, 3,3,4,4,5,5,6,6,7,7,8,8,8-tridecafluorooctanol, (1,2,2,3,3,4,4,5-octafluorocyclopentyl)methanol, (1,2,2,3,3,4,4,5-octafluorocyclopentyl)ethanol and 2-(1,2,2,3,3,4,4,5-octafluorocyclopentyl)propane-2-ol. These solvents may be used in the form of a mixture of two or more kinds thereof.

Among the above solvents, 2,2,2-trifluoroethanol, 2,2,3,3-tetrafluoropropanol, 2,2,3,4,4,4-hexafluorobutanol and 2,2,3,3,4,4,5,5-octafluoropentanol, each of which does not affect the organic material and sufficiently dissolves the fluororesin in the film-forming composition of the present invention, are particularly preferred as the fluorine-containing alcohol.

[Other Solvent]

For the purpose of viscosity adjustment, boiling point adjustment and adjustment of the solubility of the fluororesin, the solvent may include any fluorine-free solvent such as alkane, ether, alcohol, ester, ketone or aromatic hydrocarbon in addition to the fluorine-containing hydrocarbon, the fluorine-containing ether and the fluorine-containing alcohol in the film-forming composition of the present invention. The amount of the fluorine-free solvent added is preferably 20 mass % or less based on the total mass of the solvent including the fluorine-containing solvent.

For example, there can be used the following solvents having a boiling point close to that of the fluorine-containing solvent. The alkane is preferably a $C_5$-$C_{12}$ straight, branched or cyclic alkane. Specific examples of the alkane are pentane, hexane, heptane, octane, nonane, decane, undecane, dodecane, cyclopentane, cyclohexane, cycloheptane, methylcyclopentane and methylcyclohexane. The ketone is preferably a $C_5$-$C_{12}$ ketone. Specific examples of the ketone are cyclopentanone, cyclohexanone, acetone, 2-butanone, 2-pentanone, 3-pentanone, 3-methyl-2-butanone, 2-hexanone, 2-methyl-4-pentanone, 2-heptanone and 2-octanone. The ether is preferably a $C_4$-$C_{16}$ straight, branched or cyclic ether. Specific examples of the ether are diethyl ether, dipropyl ether, diisopropyl ether, dibutyl ether, diisobutyl ether, di-tert-butyl ether, dipentyl ether, diisopentyl ether, dihexyl ether, ethylene glycol dimethyl ether, ethylene glycol diethyl ether, diethylene glycol dimethyl ether, diethylene glycol diethyl ether, triethylene glycol dimethyl ether and triethylene glycol diethyl ether. The alcohol is preferably is an alcohol obtained by substituting one to three hydroxy groups on a $C_1$-$C_{10}$ straight, $C_3$-$C_{10}$ branched or $C_3$-$C_{10}$ cyclic alkyl group. Specific examples of the alcohol are methanol, ethanol, 1-propanol, 2-propanol, 1-butanol, 2-butanol, isobutanol, tert-butanol, 1-pentanol, 2-pentanol, isopentanol, 4-methyl-2-pentanol, 1-hexanol, 2-hexanol, ethylene glycol, ethylene glycol monomethyl ether, propylene glycol, propylene glycol monomethyl ether, propylene glycol monoethyl ether, diethylene glycol monomethyl ether and diethylene glycol monoethyl ether. The ester is preferably a $C_1$-$C_{12}$ ester. Specific examples of the ester are methyl acetate, ethyl acetate, propyl acetate, isopropyl acetate, butyl acetate, isobutyl acetate, pentyl acetate, hexyl acetate, methyl lactate, ethyl lactate, methyl butyrate, ethyl butyrate, propyl butyrate and propylene glycol monomethylether acetate. The aromatic hydrocarbon is preferably a $C_6$-$C_{12}$ aromatic hydrocarbon. Specific examples of the aromatic hydrocarbon are benzene, toluene, xylene, ethylbenzene, trimethylbenzene, cumene and diethylbenzene.

[Fluorine-Containing Solvent for Film-Forming Composition]

Preferred examples of the fluorine-containing solvent used in the film-forming composition of the present invention are: single solvents such as $C_4F_9OCH_3$, $C_4F_9OC_2H_5$, $CF_3CF_2CF_2CF_2CF_2CH_2CH_2CH_3$, Vertrel Suprion and Novec 7300; and mixed solvents such as a mixed solvent of $C_4F_9OCH_3$ and 2,2,3,3,4,4,5,5-octafluoropentanol in a mass ratio of 100:0.01 to 70:30, a mixed solvent of $C_4F_9OCH_3$ and 2,2,2-trifluoroethanol in a mass ratio of 100:0.01 to 70:30, a mixed solvent of $C_4F_9OCH_3$ and 2,2,3,4,4,4-hexafluorobutanol in a mass ratio of 100:0.01 to 70:30, a mixed solvent of $C_4F_9OCH_3$ and (1,2,2,3,3,4,4,5-octafluorocyclopentyl)ethanol in a mass ratio of 100:0.01 to 70:30, a mixed solvent of $C_4F_9OCH_2CH_3$ and 2,2,3,3-tetrafluoropropanol in a mass ratio of 100:0.01 to 70:30, a mixed solvent of $CF_3CF_2CF_2CF_2CF_2CH_2CH_2CH_3$ and 2,2,2-trifluoroethanol in a mass ratio of 100:0.01 to 70:30, a mixed solvent of $CF_3CF_2CF_2CF_2CF_2CH_2CH_2CH_3$ and 2,2,3,3,4,4,5,5-octafluoropentanol in a mass ratio of 100:0.01 to 70:30, a mixed solvent of $CF_3CF_2CF_2CF_2CF_2CH_2CH_2CH_3$ and 2,2,3,4,4,4-hexafluorobutanol in a mass ratio of 100:0.01 to 70:30, a mixed solvent of Vertrel Suprion and 2,2,3,3,4,4,5,5-octafluoropentanol in a mass ratio of 100:0.01 to 70:30, a mixed solvent of Novec 7300 and 2,2,3,3-tetrafluoropropanol in a mass ratio of 100:0.01 to 70:30 and a mixed solvent of Novec 7300 and 2,2,3,3,4,4,5,5-octafluoropentanol in a mass ratio of 100:0.01 to 70:30.

3. Film-Forming Composition

[Composition Ratio]

In the film-forming composition of the present invention, the amount of the fluororesin used is in the range of 0.1 to 25 parts by mass, preferably 0.5 to 20 parts by mass, per 100 parts by mass of the fluorine-containing solvent. When the amount of the fluororesin used is less than 0.1 parts by mass, the film of the fluororesin may become too small to sufficiently cover and protect the organic semiconductor element. When the amount of the fluororesin used exceeds 25 parts by mass, it may become difficult to form the uniform film of the fluororesin.

It is preferable in the film-forming composition of the present invention that: the fluorine content of the fluororesin is in the range of 30 to 65 mass %; and the fluorine content of the fluorine-containing solvent is 50 to 70 mass %. The fluororesin is readily soluble in the fluorine-containing solvent when the fluorine contents are within the above specific ranges.

The fluorine content of the fluorine-containing solvent is more preferably in the range of 50 to 70 mass %, still more preferably 55 to 70 mass %, in the film-forming composition of the present invention. When the fluorine content of the fluorine-containing solvent exceeds 70%, the fluororesin may not be sufficiently dissolved in the fluorine-containing solvent. When the fluorine content of the fluorine-containing solvent is less than 50 mass %, there may occur surface dissolution or swelling of the organic semiconductor film during the application or printing of the fluororesin on the organic semiconductor film.

[Additives]

The film-forming composition of the present invention may include any components, other than the fluororesin and the fluorine-containing solvent, as additives within the range that does not impair the organic film as the application target.

For example, a surfactant or other additive can be added to the film-forming composition for the purpose of improving the application property, leveling property, film-forming property, storage stability, defoaming property etc. of the film-forming composition. Specific examples of the surfactant are commercially available surfactants such as those available under the trade name of Megaface F142D, F172, F173, F183 from DIC Corporation, those available under the trade name of Fluorad FC-135, FC-170C, FC-430, FC-431 from Sumitomo 3M Limited, those available under the trade name of Surflon S-112, S-113, S-131, S-141 from AGC Seimi Chemical Co. Ltd., those available under the trade names of SH-28PA, SH-190, SH-193, SZ-6032 and SF-8428 available from Toray Dow Corning Corporation. The amount of the surfactant added is generally 5 parts by mass or less per 100 parts by mass of the resin in the resin composition. Herein, "Megaface" is a trade name of fluorine-based additive (surfactant or surface modifier) manufactured by DIC Corporation; "Fluorad" is a trade name of fluorosurfactant manufactured by Sumitomo 3M Limited; and "Surflon" is a trade name of fluorosurfactant manufactured by AGC Seimi Chemical Co. Ltd. These trade names are registered as trademarks.

Further, a curing agent can be added to the film-forming composition. There is no particular limitation on the kind of the curing agent added. There can be used a melamine curing agent, urea curing agent, polybasic-acid curing agent, isocyanate curing agent or epoxy curing agent. Specific examples of the curing agent are: amino compounds including isocyanates such as isophorone diisocyanate, hexamethylene diisocyanate, tolylenediisocyanate and diphenylmethane diisocyanate, and isocyanurates, block isocyanates or buret compounds thereof, melamine resins such as alkylated melamine, methylol melamine and iminomelamine, and urea resins; and epoxy compounds having two or more epoxy groups as obtained by reaction of polyhydric phenol such as bisphenol A with epichlorohydrin. The amount of the curing agent added is generally 35 parts by mass or less per 100 parts by mass of the resin in the resin composition.

4. Organic Semiconductor Film

Next, the organic semiconductor film to be processed using the film-forming composition according to the present invention will be described below. The organic semiconductor film can be of any known organic semiconductor. Examples of the organic semiconductor are organic semiconductor materials or organic charge-transfer materials, including: organic low-molecular compounds such as pentacene, anthracene, tetracene and phthalocyanine; polyacetylene-based conductive polymers; polyphenylene-based conductive polymers such as polyparaphenylene and derivatives thereof, polyphenylene vinylene and derivatives thereof and the like; heterocyclic conductive polymers such as polypyrrole and derivatives thereof, polythiophene and derivatives thereof, polyfuran and derivatives thereof and the like; and ionic conductive polymers such as polyaniline and derivatives thereof.

In the manufacturing method of the organic semiconductor element according to the present invention, it is preferable to use any organic semiconductor material that can be removed by a wet etching process using a hydrocarbon solvent or aromatic solvent as an etchant. As such an organic semiconductor material, there can be used: a condensed polycyclic aromatic hydrocarbon such as anthracene, tetracene or pentacene; organic low-molecular compound such as phthalocyanine; polyacetylene-based conductive polymer; polyphenylene-based conductive polymer such as polyparaphenylene or derivative thereof, polyphenylene vinylene or derivative thereof or the like; or heterocyclic conductive polymer such as polypyrrole or derivative thereof, polythiophene or derivative thereof, polyfuran or derivative thereof or the like. Among others, the condensed polycyclic aromatic hydrocarbon is particularly preferably applicable to the manufacturing method of the organic semiconductor element.

5. Manufacturing Method of Organic Semiconductor Element

In the manufacturing method of the organic semiconductor element, the fluororesin film is formed on the organic semiconductor film in order to protect the organic semiconductor film during the fine processing of the organic semiconductor film into a desired semiconductor circuit.

For manufacturing of the organic semiconductor element, the organic semiconductor circuit is formed by transferring a predetermined pattern to the fluororesin film by photolithography, printing process such as relief printing, intaglio printing, planographic printing, screen printing or imprint process, and then, etching the organic semiconductor film through the pattern of the fluororesin film.

First, an explanation will be given of the patterning of the fluororesin film formed from the film-forming composition of the present invention.

In the present invention, the fluororesin film is applied by wet coating of the film-forming composition to the organic semiconductor film on the substrate. The fluororesin film can be patterned by a photolithography process, print process or imprint process. By wet-etching the organic semiconductor film with the hydrocarbon solvent or aromatic solvent after the patterning of the fluororesin film on the organic semiconductor film, the pattern of the fluororesin film is transferred to the organic semiconductor film. It is thus possible in the present invention to achieve fine processing of the organic semiconductor film.

It is feasible in the present invention to directly form a pattern of protection film from the film-forming composition on the organic material by a print process or ink-jet process and then transfer the pattern of the protection film to the organic material by a wet etching process using a hydrocarbon solvent or aromatic solvent. In the case of directly forming the pattern of the protection film by the print process or ink-jet process, the film-forming composition is used as an ink. As the printing process, there can be used relief printing, intaglio printing, gravure printing, planographic printing, screen printing, heat transfer printing or reverse offset printing.

When the aromatic solvent is used as the etchant, the fluororesin film needs to be insoluble or difficult to dissolve in the etchant during the etching. After the etching, the fluororesin film is removed from or left on the resulting organic semiconductor circuit. It is desired that, when the fluororesin film is removed from the organic semiconductor circuit, the fluororesin film does not cause a deterioration of the organic semiconductor circuit. It is desired that, when the fluororesin film is left on the organic semiconductor circuit, the fluororesin film serves as an insulating film so as not to cause a short circuit of the organic semiconductor circuit.

In the case of processing an organic semiconductor film into a circuit pattern, a film-forming composition and a film formed therefrom for protection of the organic semiconductor circuit are required to satisfy the following conditions: (1) the film can be easily formed on the organic semiconductor film; (2) the film can be removed from the organic semiconductor pattern without causing a deterioration or short circuit of the organic semiconductor circuit; (3) the film has an insulating property so as not to impair the electrical characteristics of the organic semiconductor circuit; and (4) the film does not readily become affected by an aromatic solvent as an etchant.

The fluororesin film formed from the film-forming composition of the present invention can be removed as required by dissolution in a specific fluorine-containing solvent. For dissolution and removal of the fluororesin film, it is feasible to use the same fluorine-containing solvent as that of the film-forming composition as long as the influence of the solvent on the organic semiconductor is small. Alternatively, a different fluorine-containing solvent may be used to e.g. secure higher solubility of the fluororesin film.

There are some methods for dissolution and removal of the fluororesin film formed from the film-forming composition on the substrate, including immersion of the substrate in the fluorine-containing solvent, washing of the substrate by pouring the fluorine-containing solvent while holding the substrate in a vertical or inclined manner or rotating the substrate by a spin coater, or placement of the substrate under saturated vapor of the fluorine-containing solvent in a chamber. The amount of the fluorine-containing solvent used for dissolution and removal of the fluororesin film is preferably 5 times or more larger, more preferably 10 times or more larger, than the total mass of the fluororesin film. When the amount of the fluorine-containing solvent used is small, the fluororesin film cannot be removed sufficiently. The fluororesin film formed from the film-forming composition of the present invention has an insulating property and, even when remains in the organic semiconductor element without dissolution and removal, does not impair the electrical characteristics of the semiconductor circuit.

[Example of Manufacturing of Organic Semiconductor Element]

One example of the manufacturing method of the organic semiconductor element using the film-forming composition according to the present invention will be described in detail below with reference to FIG. 1. It should be however noted that the manufacturing method of the organic semiconductor element using the film-forming composition is not limited to this example.

First, an organic semiconductor film 2 is formed on a substrate 1 as shown in FIG. 1(A) by application or vapor deposition of an organic semiconductor solution.

Figure 1B:
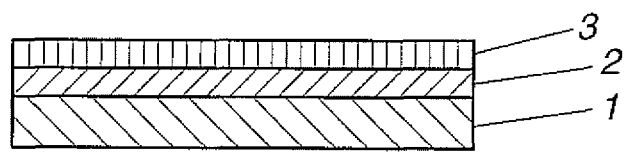

Next, a fluororesin film 3 is formed on the organic semiconductor film 2 as shown in FIG. 1(B) by application of the film-forming composition of the present invention.

The film-forming composition can be applied by e.g. dip coating, spray coating, spin coating, bar coating, applicator or roll coater. The coating film of the film-forming composition as applied to the organic semiconductor film 2 contains the solvent. The fluororesin film 3 is thus obtained by subjecting the coating film to air drying.

The substrate 1 is then heated for baking of the fluororesin film 3. During the baking, the heating temperature is 250° C. or lower. There is no need to heat the fluororesin film at a temperature higher than 250° C. The heating temperature is varied depending on the boiling point of the solvent and is preferably in the range of 10 to 150° C. When the heating temperature is lower than 10° C., it takes long time to dry the fluororesin film. When the heating temperature is higher than 150° C., the surface flatness of the fluororesin film 3 may be impaired. Further, the heating time is in the range of 30 seconds to 15 minutes. When the heating time is shorter than 30 seconds, the solvent may remain in the fluororesin film. There is no need to heat the fluororesin film for longer than 15 minutes.

Figure 1C:
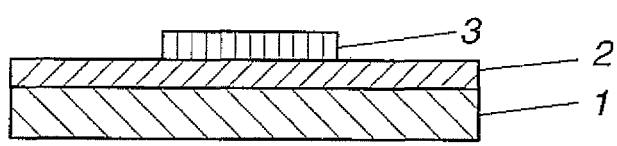

The fluororesin film 3 is subsequently patterned, as shown in FIG. 1(C), by a lithography process, imprint process, print process such as relief printing, intaglio printing, gravure printing, planographic printing, screen printing, heat transfer printing or reverse offset printing, or ink-jet process.

In the case of patterning the fluororesin film 3 by the lithography process, a photoresist film is first formed on the fluororesin film although not shown in the drawing. The photoresist film can be formed by applying a photoresist with a solvent that does not affect the fluororesin film 3 or by adhering a dry film resist. When the photoresist film is formed by application of the photoresist, it is preferable to use a hydrocarbon solvent or aromatic solvent that does not affect the fluororesin film 3. The photoresist film is exposed through a photo mask and thereby processed into a photoresist pattern. Then, the fluororesin film 3 is patterned by wet etching with an etchant solvent, reactive ion etching or gas etching.

In the case of patterning the fluororesin film 3 by the print process, a pattern is transferred from a printing original plate to the fluororesin film 3. The pattern can be transferred by pressing projections and depressions of the printing original plate against the fluororesin film 3 or by pressing only projections of the printing original plate against the fluororesin film 3 and thereby removing the corresponding regions of the fluororesin film 3. When the pattern of the printing original plate is transferred to the fluororesin film 3, it is preferable to soften the fluororesin film 3 by heating or solvent swelling and thereby easily change the shape of the fluororesin film 3.

In the case of patterning the fluororesin film 3 by the ink-jet process, an etching resistant material is ink-jetted onto regions of the fluororesin film 3 to be left. Then, the fluororesin film 3 is patterned by etching uncoated regions of the fluororesin film 3. For such patterning, there can be used wet etching using a solvent, reactive ion etching or gas etching.

At this time, the substrate 1 may be heated for baking of the patterned fluororesin film 3. During the baking, the heating temperature is 250° C. or lower. There is no need to heat the fluororesin film at a temperature higher than 250° C. The heating temperature is varied depending on the boiling point of the solvent and is preferably in the range of 10 to 150° C. When the heating temperature is lower than 10° C., it takes long time to dry the fluororesin film. When the heating temperature is higher than 150° C., the surface flatness of the fluororesin film 3 may be impaired. The heating time is in the range of 30 seconds to 15 minutes. When the heating time is shorter than 30 seconds, the solvent may remain in the fluororesin film. There is no need to heat the fluororesin film for longer than 15 minutes. The patterned fluororesin film 3 serves as a protection on regions of the organic resin film 2 to be patterned during the subsequent wet etching step.

Figure 1D:
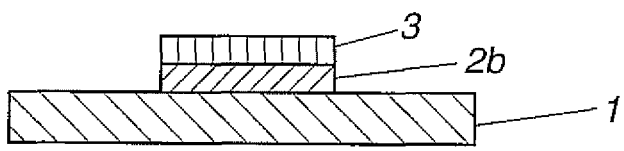

After that, the organic semiconductor film 2 is wet-etched into a pattern 2b as shown in FIG. 1(D). More specifically, any regions of the organic semiconductor film 2 which are not covered by the patterned fluororesin film 3 are dissolved and removed by immersing the laminate of the substrate 1, the organic semiconductor film 2 and the patterned fluororesin film 3 in the hydrocarbon solvent or aromatic solvent or by pouring the hydrocarbon solvent or aromatic solvent over the laminate of the substrate 1, the organic semiconductor film 2 and the patterned fluororesin film 3. By this, the pattern of the fluororesin film 3 is transferred to the organic semiconductor film 2 and obtained as the pattern 2b.

Figure 1E:

As shown in FIG. 1(E), it is feasible to remove the fluororesin film 3 by dissolution in a fluorine-containing solvent. There can be used the same fluorine-containing solvent as that of the film-forming composition. The fluororesin film can be dissolved and removed by immersing the substrate 1 in the fluorine-containing solvent, by pouring the fluorine-containing solvent film over the substrate 1 while holding the substrate 1 in a vertical or inclined manner or rotating the substrate 1 by a spin coater, or by placing the substrate 1 under saturated vapor of the fluorine-containing solvent in a chamber. The fluororesin film 3 may alternatively remain as an interlayer insulating film.

6. Device Cleaning Method

The fluororesin contained in the film-forming composition for formation of the fluororesin film is soluble in a ketone, ether or carboxylic acid ester. The application equipment used for formation of the fluororesin film 3 can be thus cleaned by such an organic solvent. The cleaning method is determined depending on the shape and environment of the equipment. It is feasible to clean the equipment by immersing the equipment in the organic solvent, by spraying the organic solvent onto the equipment and then flowing the organic solvent away from the equipment, or by spraying the organic solvent onto the equipment and then wiping the organic solvent off the equipment.

7. Effects of the Invention

As mentioned above, the film-forming composition of the present invention is characterized by containing: the specific fluorine-containing solvent that does not cause dissolution or swelling of the organic material: and the specific fluororesin soluble in the fluorine-containing solvent.

The film-forming composition of the present invention, when applied to the organic semiconductor film, does not affect the organic semiconductor film by dissolution or swelling. The fluororesin film can be thus formed from the film-forming composition on the organic semiconductor film by a wet process. Further, the fluororesin film can be patterned by a photolithography process, print process or imprint process and remain unaffected by the etchant such as hydrocarbon solvent or aromatic solvent during the wet etching of the organic semiconductor film. When the film-forming composition of the present invention is applied to the organic semiconductor film, the fluorine-containing solvent of the film-forming composition does not cause dissolution or swelling of the organic semiconductor film. The fluororesin film can be thus formed from the film-forming composition on the organic material by a wet process. Further, the fluororesin film can be patterned by a photolithography process, print process or imprint process and does not become affected by the etchant such as hydrocarbon solvent or aromatic solvent during the wet etching of the organic semiconductor film. In this way, it is possible by using the film-forming composition of the present invention to form a semiconductor circuit pattern by fine processing of the organic semiconductor film on the substrate. The film-forming composition of the present invention is therefore suitably usable for the manufacturing of the organic semiconductor element.

Moreover, the fluororesin film is suitably applicable as an interlayer insulating film in the organic semiconductor element as the fluororesin of the film-forming composition has an adequate glass transition temperature, easy processability, easy film-forming property and high heat resistance.

EXAMPLES

The present invention will be described in more detail below by way of the following examples. It should be however noted that the following examples are not intended to limit the present invention thereto.

Synthesis of Fluororesins

Unless otherwise mentioned, fluororesins for film-forming compositions were prepared by the following method.

A 50-mL egg-shaped flask of glass was used as a reaction vessel. An acrylic acid ester derivative, 2-butanone as a polymerization solvent and dimethyl-2,2-azobis(2-methylpropionate) (available under the trade name of "V-601" from Wako Pure Chemical Industries, Ltd.) as an initiator were weighed in predetermined amounts and put into the reaction vessel. A cooling pipe was attached to the reaction vessel. The inside of the reaction vessel was replaced with nitrogen through the cooling pipe while stirring the content of the reaction vessel. Then, the reaction vessel was heated in an oil bath of 80° C. for 6 hours. After the heating, the resulting reaction solution was concentrated by a rotary evaporator to 1.5 times the total mass of the monomer used. The concentrated solution was mixed with as much heptane as 15 times the total mass of the monomer used, thereby forming a precipitate. The precipitate was filtered out and dried by heating at 65° C. in a drying machine as vacuumed by an oil pump. By this, the target fluororesin was obtained.

The weight-average molecular weight Mw and molecular weight distribution (Mw/Mn; division of the molecular-average molecular weight by the number-average molecular weight) of the fluororesin was measured by gel permeation chromatography (GPC). The GPC was herein performed using a GPC analyzer: model "HLC-8320" manufactured by Tosoh Corporation with a series connection of three columns (trade name "TSKgel GMH$_{XL}$" manufactured by Tosoh Corporation), tetrahydrofuran as a developing solvent and a refractive index detector as a detector. The fluorine content of the fluororesin were determined based on a $F^{19}$-NMR spectrum as measured by a nuclear magnetic resonance spectrometer (model "JNM-ECA 400" manufactured by JEOL Ltd.). More specifically, 25 to 35 mg of the fluororesin and 5 to 10 mg of 1,4-bis(trifluoromethyl)benzene as internal reference substance were weighed and dissolved in 0.9 g of deuterated chloroform. The $F^{19}$-NMR spectrum of the resulting solution was measured. Further, the amount of the acrylic acid ester derivative-derived repeating unit in the fluororesin was determined by conversion of the ratio between the peak intensity of the acrylic acid ester derivative and the peak intensity of the internal reference substance in the $F^{19}$-NMR spectrum.

Fluororesin Synthesis Example 1

In a reaction vessel, 5.00 g (25.0 mmol) of 2,2,3,3-tetrafluoropropyl methacrylate, 10.0 g of butanone and 0.575 g (2.50 mmol) of initiator were placed. The resulting solution was subjected to radical polymerization by the method described in the above section "Synthesis of Fluororesins". As a result, there was obtained 4.90 g of fluororesin 1 having a repeating unit of the following formula (9). The yield of the fluororesin 1 relative to the total mass of the monomer used was 98 mass %. The weight-average molecular weight Mw of the fluororesin 1 was 11,000. The molecular weight distribution Mw/Mn of the fluororesin 1 was 1.34. The fluorine content of the fluororesin 1 was 38 mass %.

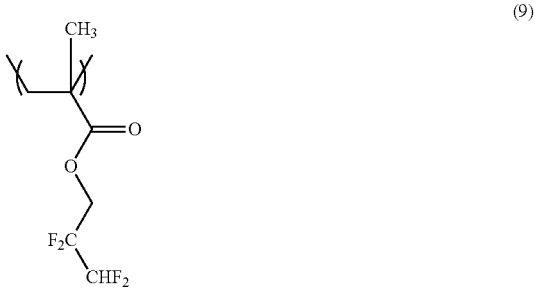

(9)

Fluororesin Synthesis Example 2

In a reaction vessel, 5.00 g (16.7 mmol) of 2,2,3,3,4,4,5,5-octafluoropentyl methacrylate, 10.0 g of butanone and 0.384 g (1.67 mmol) of initiator were placed. The resulting solution was subjected to radical polymerization by the method described in the above section "Synthesis of Fluororesins". As a result, there was obtained 4.90 g of fluororesin 2 having a repeating unit of the following formula (10). The yield of the fluororesin 2 relative to the total mass of the monomer used was 80 mass %. The weight-average molecular weight Mw of the fluororesin 2 was 5,000. The molecular weight distribution Mw/Mn of the fluororesin 2 was 1.67. The fluorine content of the fluororesin 2 was 51 mass %.

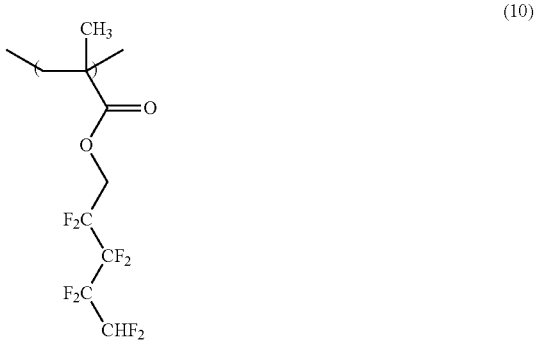 [SMILES: CCC(C)(C)C(=O)OCC(F)(F)C(F)(F)C(F)(F)C(F)F]

(10)

Fluororesin Synthesis Example 3

In a reaction vessel, 5.00 g (12.5 mmol) of 2,2,3,3,4,4,5,5,6,6,7,7-dodecafluoroheptyl methacrylate, 10.0 g of butanone and 0.288 g (1.25 mmol) of initiator were placed. The resulting solution was subjected to radical polymerization by the method described in the above section "Synthesis of Fluororesins". As a result, there was obtained 3.65 g of fluororesin 3 having a repeating unit of the following formula (11). The yield of the fluororesin 3 relative to the total mass of the monomer used was 73 mass %. The weight-average molecular weight Mw of the fluororesin 3 was 13,000. The molecular weight distribution Mw/Mn of the fluororesin 3 was 1.49. The fluorine content of the fluororesin 3 was 57 mass %.

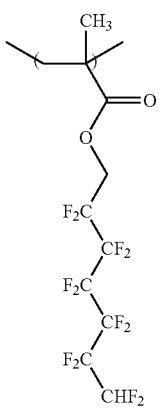

(11)

Fluororesin Synthesis Example 4

In a reaction vessel, 5.00 g (22.9 mmol) of 2,2,3,3,3-pentafluoropropyl methacrylate, 10.0 g of butanone and 0.528 g (2.29 mmol) of initiator were placed. The resulting solution was subjected to radical polymerization by the method described in the above section "Synthesis of Fluororesins". As a result, there was obtained 2.70 g of fluororesin 4 having a repeating unit of the following formula (12). The yield of the fluororesin 4 relative to the total mass of the monomer used was 54 mass %. The weight-average molecular weight Mw of the fluororesin 4 was 9,500. The molecular weight distribution Mw/Mn of the fluororesin 4 was 1.48. The fluorine content of the fluororesin 4 was 44 mass %.

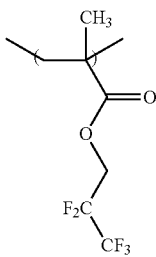

(12)

Fluororesin Synthesis Example 5

In a reaction vessel, 5.00 g (18.6 mmol) of 2,2,3,3,4,4,4-heptafluorobutyl methacrylate, 10.0 g of butanone and 0.429 g (1.86 mmol) of initiator were placed. The resulting solution was subjected to radical polymerization by the method described in the above section "Synthesis of Fluororesins". As a result, there was obtained 3.40 g of fluororesin 5 having a repeating unit of the following formula (13). The yield of the fluororesin 5 relative to the total mass of the monomer used was 68 mass %. The weight-average molecular weight Mw of the fluororesin 5 was 11,000. The molecular weight distribution Mw/Mn of the fluororesin 5 was 1.35. The fluorine content of the fluororesin 5 was 50 mass %.

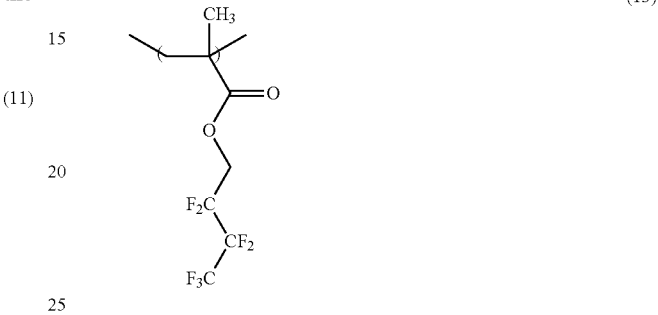

(13)

Fluororesin Synthesis Example 6

In a reaction vessel, 5.00 g (15.7 mmol) of 2,2,3,3,4,4,5,5,5-nonafluoropentyl methacrylate, 10.0 g of butanone and 0.362 g (1.57 mmol) of initiator were placed. The resulting solution was subjected to radical polymerization by the method described in the above section "Synthesis of Fluororesins". As a result, there was obtained 3.20 g of fluororesin 6 having a repeating unit of the following formula (14). The yield of the fluororesin 6 relative to the total mass of the monomer used was 64 mass %. The weight-average molecular weight Mw of the fluororesin 6 was 6,400. The molecular weight distribution Mw/Mn of the fluororesin 6 was 1.32. The fluorine content of the fluororesin 6 was 54 mass %.

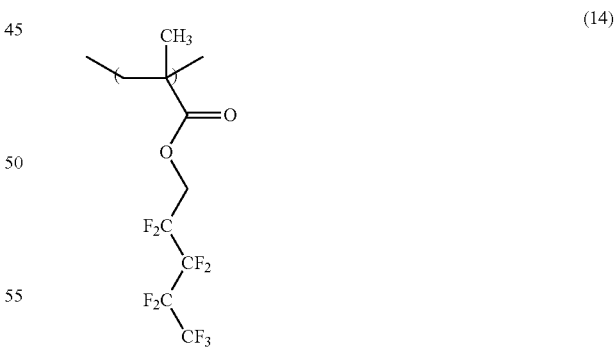

(14)

Fluororesin Synthesis Example 7

In a reaction vessel, 5.00 g (15.1 mmol) of 3,3,4,4,5,5,6,6-nonafluorohexyl methacrylate, 10.0 g of butanone and 0.347 g (1.51 mmol) of initiator were placed. The resulting solution was subjected to radical polymerization by the method described in the above section "Synthesis of Fluororesins". As a result, there was obtained 3.25 g of fluororesin 7 having a repeating unit of the following formula (15). The yield of the fluororesin 7 relative to the total mass of the monomer used was 65 mass %. The weight-average molecular weight Mw of the fluororesin 7 was 13,000. The molecular weight distribution Mw/Mn of the fluororesin 7 was 1.49. The fluorine content of the fluororesin 7 was 52 mass %.

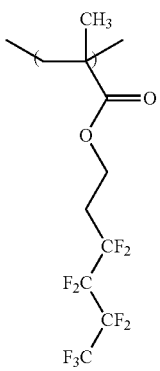

(15)

Fluororesin Synthesis Example 8

In a reaction vessel, 5.00 g (11.7 mmol) of 3,3,4,4,5,5,6,6,7,7,8,8,8-tridecafluorooctyl methacrylate, 10.0 g of butanone and 0.266 g (1.17 mmol) of initiator were placed. The resulting solution was subjected to radical polymerization by the method described in the above section "Synthesis of Fluororesins". As a result, there was obtained 3.30 g of fluororesin 8 having a repeating unit of the following formula (16). The yield of the fluororesin 8 relative to the total mass of the monomer used was 66 mass %. The weight-average molecular weight Mw of the fluororesin 8 was 4,900. The molecular weight distribution Mw/Mn of the fluororesin 8 was 1.13. The fluorine content of the fluororesin 8 was 57 mass %.

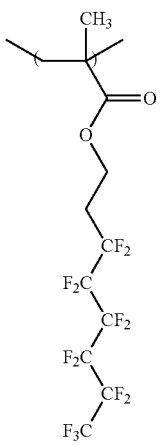

(16)

Fluororesin Synthesis Example 9

In a reaction vessel, 5.00 g (21.2 mmol) of 1,1,1,3,3,3-hexafluoroisopropyl methacrylate, 10.0 g of butanone and 0.488 g (2.12 mmol) of initiator were placed. The resulting solution was subjected to radical polymerization by the method described in the above section "Synthesis of Fluororesins". As a result, there was obtained 1.70 g of fluororesin 9 having a repeating unit of the following formula (17). The yield of the fluororesin 9 relative to the total mass of the monomer used was 34 mass %. The weight-average molecular weight Mw of the fluororesin 9 was 5,000. The molecular weight distribution Mw/Mn of the fluororesin 9 was 1.64. The fluorine content of the fluororesin 9 was 48 mass %.

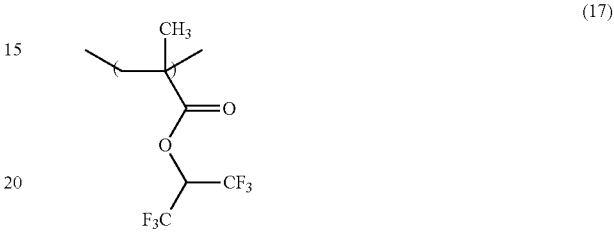

(17)

Fluororesin Synthesis Example 10

In a reaction vessel, 10.00 g (45.0 mmol) of 1,1,1,3,3,3-hexafluoroisopropyl acrylate, 10.0 g of butanone and 1.037 g (4.50 mmol) of initiator were placed. The resulting solution was subjected to radical polymerization by the method described in the above section "Synthesis of Fluororesins". As a result, there was obtained 9.00 g of fluororesin 10 having a repeating unit of the following formula (18). The yield of the fluororesin 10 relative to the total mass of the monomer used was 90 mass %. The weight-average molecular weight Mw of the fluororesin 10 was 29,000. The molecular weight distribution Mw/Mn of the fluororesin 10 was 3.00. The fluorine content of the fluororesin 10 was 51 mass %.

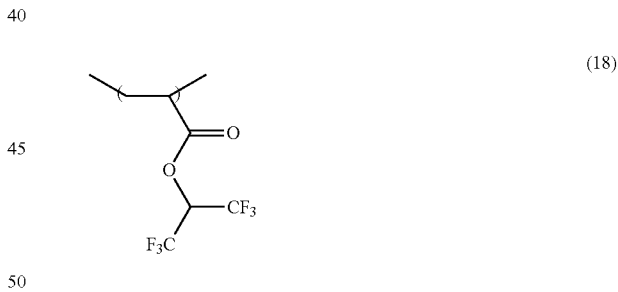

(18)

Fluororesin Synthesis Example 11

In a reaction vessel, 5.15 g (21.8 mmol) of 1,1,1,3,3,3-hexafluoroisopropyl methacrylate, 4.85 g (21.8 mmol) of 1,1,1,3,3,3-hexafluoroisopropyl acrylate, 10.0 g of butanone and 0.804 g (3.49 mmol) of initiator were placed. The resulting solution was subjected to radical polymerization by the method described in the above section "Synthesis of Fluororesins". As a result, there was obtained 9.30 g of fluororesin 11 having repeating units of the following formula (19). The yield of the fluororesin 11 relative to the total mass of the monomers used was 93 mass %. The weight-average molecular weight Mw of the fluororesin 11 was 5,400. The molecular weight distribution Mw/Mn of the fluororesin 11 was 1.86. The fluorine content of the fluororesin 11 was 50 mass %.

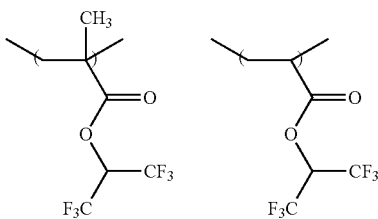

(19)

Fluororesin Synthesis Example 12

In a reaction vessel, 3.97 g (16.8 mmol) of 1,1,1,3,3,3-hexafluoroisopropyl methacrylate, 1.03 g (7.24 mmol) of butyl methacrylate, 10.0 g of butanone and 0.111 g (0.482 mmol) of initiator were placed. The resulting solution was subjected to radical polymerization by the method described in the above section "Synthesis of Fluororesins". As a result, there was obtained 3.47 g of fluororesin 12 having repeating units of the following formula (20). The yield of the fluororesin 12 relative to the total mass of the monomers used was 69 mass %. The weight-average molecular weight Mw of the fluororesin 12 was 6,600. The molecular weight distribution Mw/Mn of the fluororesin 12 was 1.47. The fluorine content of the fluororesin 12 was 38 mass %.

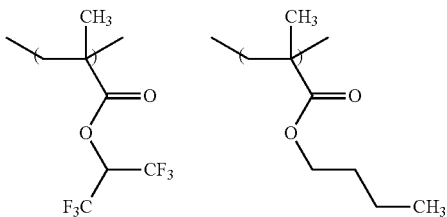

(20)

Fluororesin Synthesis Example 13

In a reaction vessel, 3.88 g (16.4 mmol) of 1,1,1,3,3,3-hexafluoroisopropyl methacrylate, 1.12 g (7.08 mmol) of 2-ethoxyethyl methacrylate, 10.0 g of butanone and 0.115 g (0.499 mmol) of initiator were placed. The resulting solution was subjected to radical polymerization by the method described in the above section "Synthesis of Fluororesins". As a result, there was obtained 3.91 g of fluororesin 13 having a repeating unit of the following formula (21). The yield of the fluororesin 13 relative to the total mass of the monomers used was 78 mass %. The weight-average molecular weight Mw of the fluororesin 13 was 16,000. The molecular weight distribution Mw/Mn of the fluororesin 12 was 1.65. The fluorine content of the fluororesin 12 was 38 mass %.

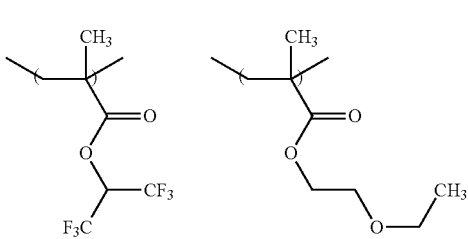

(21)

Comparative Resin Synthesis Example 1

In a reaction vessel, 5.00 g (35.2 mmol) of n-butyl methacrylate, 10.0 g of butanone and 0.162 g (0.704 mmol) of initiator were placed. The resulting solution was subjected to radical polymerization by the method described in the above section "Synthesis of Fluororesins". As a result, there was obtained 0.88 g of fluororesin 14 having a repeating unit of the following formula (22). The weight-average molecular weight Mw of the fluororesin 14 was 16,000. The molecular weight distribution Mw/Mn of the fluororesin 14 was 1.48. The yield of the fluororesin 14 relative to the total mass of the monomer used was 18 mass %.

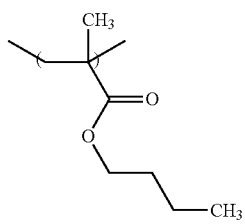

(22)

Comparative Resin Synthesis Example 2

In a reaction vessel, 10.00 g (63.2 mmol) of 2-ethoxyethyl methacrylate, 10.0 g of butanone and 0.225 g (0.977 mmol) of initiator were placed. The resulting solution was subjected to radical polymerization by the method described in the above section "Synthesis of Fluororesins". As a result, there was obtained 6.21 g of fluororesin 15 having a repeating unit of the following formula (23). The weight-average molecular weight Mw of the fluororesin 15 was 8,000. The molecular weight distribution Mw/Mn of the fluororesin 15 was 1.45. The yield of the fluororesin 15 relative to the total mass of the monomer used was 62 mass %.

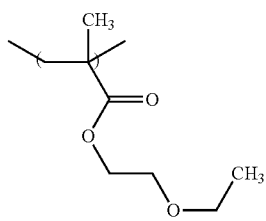

(23)

[Evaluation Test on Solubility of Fluororesins in Fluorine-Containing Solvents]

The fluororesins 1 to 13, the comparative fluorine-free resins 14 and 15 and polymethyl methacrylate (hereinafter sometimes referred to as "PMMA"; polystyrene-conversion weight-average molecular weight: 15,000) available from Sigma-Aldrich Co. LLC were tested for the solubility in various fluorine-containing solvents.

<Evaluation Method>

The solubility of the fluororesin was evaluated by mixing 10 mass % of the fluororesin as a solute in each solvent at room temperature and visually checking whether the solute was dissolved in the solvent without solid deposition or suspension or there was seen an insoluble matter by solid deposition or suspension.

<Evaluation Results>

The evaluation results are shown in TABLES 4 to 19. TABLES 4 to 16 show the evaluation results on the solubility of the fluororesins 1 to 13 according to the present invention in the various fluorine-containing solvents; TABLE 17 shows the evaluation results on the solubility of the comparative fluorine-free resin 14 (Comparative Examples 1 to 4); TABLE 18 shows the evaluation results on the solubility of the comparative fluorine-free resin 15 (Examples 5 to 8); and TABLE 19 shows the evaluation results on the solubility of the PMMA (Comparative Examples 9 to 11).

The fluororesins 1 to 13 were soluble in the fluorine-containing solvents as shown in TABLES 4 to 16. On the other hand, the comparative fluorine-free resins 14 and 15 were insoluble in fluorine-containing solvents as shown in TABLES 17 and 18. The PMMA was also insoluble in fluorine-containing solvents as shown in TABLE 19. In each table, "Novec" is a trade name of hydrofluoroether (HFE) manufactured by Sumitomo 3M Limited; and "Vertrel Suprion" is a trade name of fluorine-based solvent manufactured by Du Pont-Mitsui Fluorochemicals Co., Ltd. These trade names are registered as trademarks.

TABLE 4

Evaluation results on Solubility of Fluororesin 1

| | Solvent | Evaluation |
|---|---|---|
| Example 1 | A mixed solvent of $C_4H_9OCH_3$ and 2,2,2-trifluoroethanol in a mass ratio of 7:3 | Soluble |

TABLE 5

Evaluation results on Solubility of Fluororesin 2

| | Solvent | Evaluation |
|---|---|---|
| Example 2 | $CF_3CF_2CF_2CF_2CF_2CH_2CH_2CH_3$ | Soluble |

TABLE 6

Evaluation results on Solubility of Fluororesin 3

| | Solvent | Evaluation |
|---|---|---|
| Example 3 | $CF_3CF_2CF_2CF_2CF_2CH_2CH_2CH_3$ | Soluble |
| Example 4 | A mixed solvent of $CF_3CF_2CF_2CF_2CF_2CH_2CH_2CH_3$ and 2,2,2-trifluoroethanol in a mass ratio of 7:3 | |
| Example 5 | Vertrel Suprion | |
| Example 6 | A mixed solvent of $C_4H_9OCH_3$ and 2,2,3,3,4,4,5,5-octafluoropentanol in a mass ratio of 7:3 | |

TABLE 7

Evaluation results on Solubility of Fluororesin 4

| | Solvent | Evaluation |
|---|---|---|
| Example 7 | $CF_3CF_2CF_2CF_2CF_2CH_2CH_2CH_3$ | Soluble |
| Example 8 | A mixed solvent of $CF_3CF_2CF_2CF_2CF_2CH_2CH_2CH_3$ and 2,2,3,3,4,4,5,5-octafluoropentanol in a mass ratio of 7:3 | |
| Example 9 | $C_4H_9OCH_3$ | |
| Example 10 | Vertrel Suprion | |

TABLE 7-continued

Evaluation results on Solubility of Fluororesin 4

| | Solvent | Evaluation |
|---|---|---|
| Example 11 | A mixed solvent of Novec 7300 and 2,2,3,3-tetrafluoropropanol in a mass ratio of 7:3 | |

TABLE 8

Evaluation results on Solubility of Fluororesin 5

| | Solvent | Evaluation |
|---|---|---|
| Example 12 | $CF_3CF_2CF_2CF_2CF_2CH_2CH_2CH_3$ | Soluble |
| Example 13 | A mixed solvent of $CF_3CF_2CF_2CF_2CF_2CH_2CH_2CH_3$ and 2,2,2-trifluoroethanol in a mass ratio of 7:3 | |
| Example 14 | Novec 7300 | |
| Example 15 | $C_4F_9OC_2H_5$ | |
| Example 16 | Vertrel Suprion | |
| Example 17 | A mixed solvent of Vertrel Suprion and 2,2,3,3,4,4,5,5-octafluoropentanol in a mass ratio of 7:3 | |

TABLE 9

Evaluation results on Solubility of Fluororesin 6

| | Solvent | Evaluation |
|---|---|---|
| Example 18 | $CF_3CF_2CF_2CF_2CF_2CH_2CH_2CH_3$ | Soluble |
| Example 19 | A mixed solvent of $CF_3CF_2CF_2CF_2CF_2CH_2CH_2CH_3$ and 2,2,3,3,4,4,5,5-octafluoropentanol in a mass ratio of 7:3 | |
| Example 20 | Novec 7300 | |
| Example 21 | A mixed solvent of $C_4H_9OCH_3$ and 2,2,3,4,4,4-hexafluorobutanol in a mass ratio of 7:3 | |

TABLE 10

Evaluation results on Solubility of Fluororesin 7

| | Solvent | Evaluation |
|---|---|---|
| Example 22 | A mixed solvent of $CF_3CF_2CF_2CF_2CF_2CH_2CH_2CH_3$ and 2,2,3,3,4,4,5,5-octafluoropentanol in a mass ratio of 7:3 | Soluble |
| Example 23 | $C_4F_9OCH_3$ | |
| Example 24 | Vertrel Suprion | |
| Example 25 | A mixed solvent of $C_4H_9OCH_3$ and 2,2,3,3,4,4,5,5-octafluoropentanol in a mass ratio of 7:3 | |

TABLE 11

Evaluation results on Solubility of Fluororesin 8

| | Solvent | Evaluation |
|---|---|---|
| Example 26 | $CF_3CF_2CF_2CF_2CF_2CH_2CH_2CH_3$ | Soluble |
| Example 27 | A mixed solvent of $CF_3CF_2CF_2CF_2CF_2CH_2CH_2CH_3$ and 2,2,3,4,4,4-hexafluorobutanol in a mass ratio of 7:3 | |

TABLE 11-continued

Evaluation results on Solubility of Fluororesin 8

| | Solvent | Evaluation |
|---|---|---|
| Example 28 | Novec 7300 | |
| Example 29 | Vertrel Suprion | |
| Example 30 | A mixed solvent of $C_4F_9OCH_3$ and (1,2,2,3,3,4,4,5-octafluorocyclopentyl)ethanol in a mass ratio of 7:3 | |

TABLE 12

Evaluation results on Solubility of Fluororesin 9

| | Solvent | Evaluation |
|---|---|---|
| Example 31 | A mixed solvent of $CF_3CF_2CF_2CF_2CH_2CH_2CH_3$ and 2,2,3,3,4,4,5,5-octafluoropentanol in a mass ratio of 7:3 | Soluble |
| Example 32 | $C_4F_9OCH_2CH_3$ | |
| Example 33 | Novec 7300 | |
| Example 34 | Vertrel Suprion | |
| Example 35 | A mixed solvent of $C_4F_9OCH_3$ and 2,2,2-trifluoroethanol in a mass ratio of 7:3 | |
| Example 36 | A mixed solvent of $C_4F_9OCH_2CH_3$ and 2,2,3,3-tetrafluoropropanol in a mass ratio of 7:3 | |
| Example 37 | A mixed solvent of Novec 7300 and 2,2,3,3,4,4,5,5-octafluoropentanol in a mass ratio of 7:3 | |

TABLE 13

Evaluation results on Solubility of Fluororesin 10

| | Solvent | Evaluation |
|---|---|---|
| Example 38 | $CF_3CF_2CF_2CF_2CF_2CH_2CH_2CH_3$ | Soluble |
| Example 39 | A mixed solvent of $CF_3CF_2CF_2CF_2CF_2CH_2CH_2CH_3$ and 2,2,2-trifluoroethanol in a mass ratio of 7:3 | |
| Example 40 | $C_4F_9OCH_2CH_3$ | |
| Example 41 | Vertrel Suprion | |
| Example 42 | A mixed solvent of $C_4F_9OCH_2CH_3$ and 2,2,3,3-tetrafluoropropanol in a mass ratio of 7:3 | |
| Example 43 | A mixed solvent of Vertrel Suprion and 2,2,3,3,4,4,5,5-octafluoropentanol in a mass ratio of 7:3 | |

TABLE 14

Evaluation results on Solubility of Fluororesin 11

| | Solvent | Evaluation |
|---|---|---|
| Example 44 | $CF_3CF_2CF_2CF_2CF_2CH_2CH_2CH_3$ | Soluble |
| Example 45 | A mixed solvent of $CF_3CF_2CF_2CF_2CF_2CH_2CH_2CH_3$ and 2,2,2-trifluoroethanol in a mass ratio of 7:3 | |
| Example 46 | $C_4F_9OCH_2CH_3$ | |
| Example 47 | Vertrel Suprion | |
| Example 48 | A mixed solvent of $C_4F_9OCH_2CH_3$ and 2,2,3,3-tetrafluoropropanol in a mass ratio of 7:3 | |
| Example 49 | A mixed solvent of Vertrel Suprion and 2,2,3,3,4,4,5,5-octafluoropentanol in a mass ratio of 7:3 | |

TABLE 15

Evaluation results on Solubility of Fluororesin 12

| | Solvent | Evaluation |
|---|---|---|
| Example 50 | A mixed solvent of $CF_3CF_2CF_2CF_2CH_2CH_2CH_3$ and 2,2,2-trifluoroethanol in a mass ratio of 7:3 | Soluble |
| Example 51 | $C_4F_9OCH_2CH_3$ | |
| Example 52 | Vertrel Suprion | |
| Example 53 | A mixed solvent of $C_4F_9OCH_2CH_3$ and 2,2,3,3-tetrafluoropropanol in a mass ratio of 7:3 | |
| Example 54 | A mixed solvent of Vertrel Suprion and 2,2,3,3,4,4,5,5-octafluoropentanol in a mass ratio of 7:3 | |

TABLE 16

Evaluation results on Solubility of Fluororesin 13

| | Solvent | Evaluation |
|---|---|---|
| Example 55 | A mixed solvent of $CF_3CF_2CF_2CF_2CF_2CH_2CH_2CH_3$ and 2,2,2-trifluoroethanol in a mass ratio of 7:3 | Soluble |
| Example 56 | $C_4F_9OCH_2CH_3$ | |
| Example 57 | Vertrel Suprion | |
| Example 58 | A mixed solvent of $C_4F_9OCH_2CH_3$ and 2,2,3,3-tetrafluoropropanol in a mass ratio of 7:3 | |
| Example 59 | A mixed solvent of Vertrel Suprion and 2,2,3,3,4,4,5,5-octafluoropentanol in a mass ratio of 7:3 | |

TABLE 17

Evaluation results on Solubility of Comparative Resin 14

| | Solvent | Evaluation |
|---|---|---|
| Comparative Example 1 | $CF_3CF_2CF_2CF_2CF_2CH_2CH_2CH_3$ | Solid Deposition |
| Comparative Example 2 | A mixed solvent of $CF_3CF_2CF_2CF_2CF_2CH_2CH_2CH_3$ and 2,2,3,3,4,4,5,5-octafluoropentanol in a mass ratio of 7:3 | Solid Deposition |
| Comparative Example 3 | Novec 7300 | Solid Deposition |
| Comparative Example 4 | A mixed solvent of Novec 7300 and 2,2,3,3,4,4,5,5-octafluoropentanol in a mass ratio of 7:3 | Suspension |

TABLE 18

Evaluation results on Solubility of Comparative Resin 15

| | Solvent | Evaluation |
|---|---|---|
| Comparative Example 5 | $CF_3CF_2CF_2CF_2CF_2CH_2CH_2CH_3$ | Solid Deposition |
| Comparative Example 6 | A mixed solvent of $CF_3CF_2CF_2CF_2CF_2CH_2CH_2CH_3$ and 2,2,3,3,4,4,5,5-octafluoropentanol in a mass ratio of 7:3 | Solid Deposition |
| Comparative Example 7 | Vertrel Suprion | Suspension |
| Comparative Example 8 | A mixed solvent of Vertrel Suprion and 2,2,3,3,4,4,5,5-octafluoropentanol in a mass ratio of 7:3 | Suspension |

TABLE 19

Evaluation results on Solubility of PMMA

| | Solvent | Evaluation |
|---|---|---|
| Comparative Example 9 | $CF_3CF_2CF_2CF_2CF_2CH_2CH_2CH_3$ | Solid Deposition |
| Comparative Example 10 | $C_4F_9OCH_2CH_3$ | Solid Deposition |
| Comparative Example 11 | A mixed solvent of $C_4F_9OCH_2CH_3$ and 2,2,3,3,4,4,5,5-octafluoropentanol in a mass ratio of 7:3 | Solid Deposition |

[Evaluation Test on Cleanability of Film-Forming Compositions]

<Evaluation Method>

Fluororesin films containing the fluororesins 1 to 13 obtained in Synthesis Examples 1 to 13 were tested for the cleanability in three kinds of fluorine-free solvents: 2-butanone, propylene glycol monomethyl ether acetate and ethyl acetate (Examples 60 to 72). Herein, the fluororesin films were formed from film-forming compositions each using a mixed solvent of Novec 7300, Vertrel Suprion and 2,2,3,3,4,4,5,5-octafluoropentanol in a mass ratio of 3:3:4. The resin concentrations of the respective film-forming compositions were set to 10 mass %.

More specifically, each of the film-forming compositions containing the fluororesins 1 to 13 was applied to a silicon substrate. The thus-coated substrate was immersed in the cleaning solvent. After a lapse of 30 seconds, the substrate was taken out of the cleaning solvent and died by air blowing. Then, the substrate was analyzed by an optical interference film thickness meter (model "FTP 300" manufactured by Sentech Instruments, Germany) to check whether there was a residue of the film on the substrate. The film-forming composition was evaluated as "cleanable" when there was seen no film residue.

<Evaluation Results>

The evaluation results are shown in TABLE 20. As shown in TABLE 20, all of the fluororesins 1 to 13 were cleanable by the three kinds of fluorine-free cleaning solvents with no film residue.

TABLE 20

| | Kind of Resin | 2-Butanone | PGMEA | Ethyl Acetate |
|---|---|---|---|---|
| Example 60 | Fluororesin 1 | No film residue | No film residue | No film residue |
| Example 61 | Fluororesin 2 | | | |
| Example 62 | Fluororesin 3 | | | |
| Example 63 | Fluororesin 4 | | | |
| Example 64 | Fluororesin 5 | | | |
| Example 65 | Fluororesin 6 | | | |
| Example 66 | Fluororesin 7 | | | |
| Example 67 | Fluororesin 8 | | | |
| Example 68 | Fluororesin 9 | | | |
| Example 69 | Fluororesin 10 | | | |
| Example 70 | Fluororesin 11 | | | |
| Example 71 | Fluororesin 12 | | | |
| Example 72 | Fluororesin 13 | | | |

PGMA: propylene glycol monomethyl ether acetate

[Evaluation Test on Resistance of Fluororesins to Wet-Etching Solvents]

<Evaluation Method>

Fluororesin films containing the fluororesins 1 to 3, films containing the comparative fluorine-free resins 14 and 15 and film containing PMMA were tested for the resistance to wet-etching solvents. More specifically, the fluororesin films were formed by preparing film-forming compositions containing the fluororesins 1 to 13 according to the present invention, film-forming compositions containing the comparative fluorine-free resins 14 and 15 and film-forming composition containing the PMMA, and then, applying the film-forming compositions to silicon substrates (diameter: 10 cm, with natural oxidation films formed on respective surfaces). Each of the thus-coated substrates was immersed in the wet-etching solvent for 5 minutes. The film was evaluated as having resistance to the wet-etching solvent when the thickness of the film after the immersion was 30% or more of the thickness of the film before the immersion.

For the formation of the fluororesin films on the silicon substrates, the film-forming compositions were prepared by combination of the fluororesins (concentration: 3 mass %) with a fluorine-containing solvent and applied to the silicon substrates by spin coating; and the resulting coating films were each dried by heating on a hot plate of 130° C. for 3 minutes. The fluorine-containing solvent used was a mixed solvent of $C_4F_9OCH_2CH_3$, Vertrel Suprion and 2,2,3,3,4,4,5,5-octafluoropentanol in a mass ratio of 4:4:2. The thickness of the film was measured by an optical interference film thickness meter (model "FTP 300" manufactured by Sentech Instruments, Germany). The concentrations of the film-forming composition and the spin coating conditions were adjusted in such a manner that the thickness of the film was in the range of 150 to 300 nm. As the wet-etching solvents, three kinds of solvents: benzene, toluene and xylene were used.

<Evaluation Results>

As a result of the evaluation test, all of the fluororesin films containing the fluororesins 1 to 3 had resistance to the above three wet-etching solvents. On the other hand, the films containing the comparative fluorine-free resins 14 and 15 and the films containing the PMMA did not have resistance to the above three wet-etching solvents.

[Evaluation Test on Insulating Property of Films]

<Evaluation Method>

The fluororesins 1 to 13 were tested for the electrical insulating property. More specifically, fluororesin films containing the fluororesins 1 to 13 were formed on metal substrates (diameter: 7.5 cm, material: SUS-316) by preparing and applying film-forming compositions according to the present invention. Then, gold electrodes (circular shape, diameter: 4 cm) were formed by sputtering on the fluororesin films. With the application of a voltage between the substrate and the electrode, the occurrence of breakdown in the fluororesin film was examined.

For the formation of the fluororesin films on the metal substrates, the film-forming compositions were prepared by combination of the fluororesins 1 to 13 (concentration: 3 mass %) with a fluorine-containing solvent and applied to the metal substrates by spin coating; and the resulting coating films were each dried by heating on a hot plate of 130° C. for 3 minutes. The fluorine-containing solvent used was a mixed solvent of $C_4F_9OCH_2CH_3$, Vertrel Suprion and 2,2,3,3,4,4,5,5-octafluoropentanol in a mass ratio of 4:4:2. The concentration of the film-forming composition and the spin coating conditions were adjusted in such a manner that the thickness of the film was in the range of 150 to 300 nm. The test voltage was set to 1.5 kV/mm based on the thickness of the fluororesin film.

<Evaluation Results>

As a result of the evaluation test, there was seen no breakdown in any of the fluororesin films with the application of the test voltage. All of the fluororesins thus had an electrical insulating property.

[Evaluation Test on Application Property of Film-Forming Compositions to Organic Semiconductor Films]

<Evaluation Method>

The fluororesins 1 to 13 were tested for the application property to organic semiconductor films by the following procedure. As shown in FIG. 1, an organic semiconductor film 2 was formed on a silicon substrate of 10 cm diameter. A fluororesin film 3 was formed from a film-forming composition according to the present invention on the organic semiconductor film 2. After that, a cross section of the thus-obtained substrate was observed by an optical microscope. When there was seen layer lamination of the organic semiconductor film 2 and the fluororesin film 3, the fluororesin was evaluated as having good application property and being properly applicable to the organic semiconductor film. The material of the organic semiconductor film herein used was anthracene as an example of low-molecular polycyclic aromatic hydrocarbon soluble in an aromatic hydrocarbon solvent.

More specifically, an anthracene film was formed with a thickness of 100 nm as the organic semiconductor film 2 by preparing a solution of 0.10 mass % anthracene in toluene, casting the prepared solution on the silicon substrate and drying the casted coating at room temperature. For the formation of the fluororesin film 3, each of the fluororesins 1 to 4 was added at a concentration of 3 mass % to a mixed solvent of Novec 7300 and 2,2,3,3,4,4,5,5-octafluoropentanol in a mass ratio of 7:3; and the resulting film-forming composition was applied by spin coating to the anthracene film-coated substrate and dried at room temperature for 10 minutes.

<Evaluation Results>

As a result of the evaluation test, the anthracene film 2 and the fluororesin film 3 were laminated in layers in each example. All of the film-forming compositions containing the fluororesins 1 to 13 were thus applicable on the organic semiconductor films.

[Evaluation Test on Protection of Organic Semiconductor Films by Fluororesin Films]

<Evaluation Method>

Fluororesin films 3 formed from the fluororesins 1 to 13 were tested for the ability to be removed from organic semiconductor anthracene films 2. The material of the organic semiconductor film 2 used was anthracene as an example of low-molecular polycyclic aromatic hydrocarbon soluble in an aromatic hydrocarbon solvent.

More specifically, the anthracene film 2 was formed on a silicon substrate. The silicon substrate used was the same as above. The fluororesin film 3 was formed from the film-forming composition on the organic semiconductor film 2. Then, the substrate on which the anthracene film 2 and the fluororesin film 3 were laminated in layers was immersed in toluene for 30 seconds and subsequently immersed for 60 seconds in a fluorine-containing solvent for dissolution and removal of the fluororesin film 3. The fluororesin film 3 was evaluated as being able to protect the anthracene film 2 and being removable without affecting the organic semiconductor film 2 when the anthracene film 2 was present on the silicon substrate and did not show a thickness change of 10% or more after the dissolution and removal of the fluororesin film 3 by the fluorine-containing solvent.

For the formation of the fluororesin film 3, each of the fluororesins 1 to 13 was added at a concentration of 3 mass % to a mixed solvent of Novec 7300 and 2,2,3,3,4,4,5,5-octafluoropentanol in a mass ratio of 7:3; and the resulting film-forming composition was applied by spin coating to the anthracene film-coated substrate and dried at room temperature for 10 minutes.

<Evaluation Results>

A thickness change of 10% or more did not occur in any of the anthracene films 2 when the fluororesin films 3 were removed by dissolution in the fluorine-containing solvent Novec 7200 after the immersion in toluene for 30 seconds. It was thus possible to achieve protection of the anthracene film 2 and separation of the fluororesin film 3.

DESCRIPTION OF REFERENCE NUMERALS

1: Substrate
2: Organic semiconductor film or anthracene film
3: Fluororesin film
2b: Pattern

The invention claimed is:

1. A film-forming composition for forming a fluororesin film on an organic semiconductor film, comprising:
a fluororesin having a repeating unit of the general formula (1)

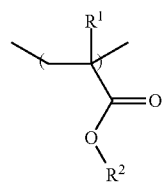

(1)

where $R^1$ each independently represents a hydrogen atom, a fluorine atom, a methyl group or a trifluoromethyl group; and $R^2$ each independently represents a $C_1$-$C_{15}$ straight, $C_3$-$C_{15}$ branched or $C_3$-$C_{15}$ cyclic fluorine-containing hydrocarbon group in which any hydrogen atom may be replaced by a fluorine atom with the proviso that the repeating unit contains at least one fluorine atom; and
a fluorine-containing solvent,
wherein the fluorine-containing solvent includes either a fluorine-containing hydrocarbon or a fluorine-containing ether;
wherein the fluorine-containing hydrocarbon is a $C_4$-$C_8$ straight, branched or cyclic hydrocarbon in which at least one hydrogen atom is replaced by a fluorine atom; and
wherein the fluorine-containing ether is a fluorine-containing ether of the general formula (2)

$$R^3\text{—O—}R^4 \quad (2)$$

where $R^3$ and $R^4$ each independently represent a $C_1$-$C_{15}$ straight, $C_3$-$C_{15}$ branched or $C_3$-$C_{15}$ cyclic hydrocarbon group; and at least one hydrogen atom of the ether is replaced by a fluorine atom.

2. The film-forming composition according to claim 1, wherein the fluorine-containing solvent further includes a fluorine-containing alcohol of the general formula (3)

$$R^5\text{—OH} \quad (3)$$

where $R^5$ represents a $C_1$-$C_{15}$ straight, $C_3$-$C_{15}$ branched or $C_3$-$C_{15}$ cyclic hydrocarbon group in which at least one hydrogen atom is replaced by a fluorine atom.

3. The film-forming composition according to claim 1, wherein the fluororesin has a fluorine content of 30 to 65 mass %.

4. The film-forming composition according to claim 1, wherein the fluorine-containing solvent has a fluorine content of 50 to 70 mass %.

5. A fluororesin film formed by applying the film-forming composition according to claim 1 onto an organic semiconductor film.

6. A manufacturing method of an organic semiconductor element, comprising:
applying the film-forming composition according to claim 1 onto an organic semiconductor film, thereby forming a fluororesin film;
patterning the fluororesin film; and
etching the organic semiconductor film into a pattern.

7. The manufacturing method according to claim 6, wherein the patterning of the fluororesin film is performed by a photolithography process.

8. The manufacturing method according to claim 6, wherein the patterning of the fluororesin film is performed by a print process.

9. The manufacturing method according to claim 6, wherein the patterning of the fluororesin film is performed by an imprint process.

10. The manufacturing method according to claim 6, wherein the etching of the organic semiconductor film is performed by a wet etching process using an aromatic solvent.

11. The manufacturing method according to claim 10, wherein the aromatic solvent is benzene, toluene or xylene.

12. The manufacturing method according to claim 6, further comprising: removing the fluororesin film.

13. The manufacturing method according to claim 12, wherein the removing of the fluororesin film is performed by dissolving the fluororesin film in a fluorine-containing solvent.

14. The manufacturing method according to claim 6, wherein the fluorine-containing solvent further includes a fluorine-containing alcohol of the general formula (3)

$$R^5\text{---OH} \qquad (3)$$

where $R^5$ represents a $C_1$-$C_{15}$ straight, $C_3$-$C_{15}$ branched or $C_3$-$C_{15}$ cyclic hydrocarbon group in which at least one hydrogen atom is replaced by a fluorine atom.

15. An organic semiconductor element manufactured by the manufacturing method according to claim 6.

16. An organic electroluminescence display comprising the organic semiconductor element according to claim 15.

17. A liquid crystal display comprising the organic semiconductor element according to claim 15.

* * * * *